(12) United States Patent
Lu

(10) Patent No.: US 7,910,962 B2
(45) Date of Patent: Mar. 22, 2011

(54) SOI TRENCH LATERAL IGBT

(75) Inventor: Hong-fei Lu, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 156 days.

(21) Appl. No.: 12/102,000

(22) Filed: Apr. 13, 2008

(65) Prior Publication Data

US 2009/0008675 A1    Jan. 8, 2009

Related U.S. Application Data

(63) Continuation of application No. PCT/JP2005/018798, filed on Oct. 12, 2005.

(51) Int. Cl.
*H01L 31/62* (2006.01)
(52) U.S. Cl. ......... 257/260; 257/E21.564; 257/E28.027; 257/E29.201
(58) Field of Classification Search ........... 257/E21.564, 257/E29.027, E29.127, E29.201, 260
See application file for complete search history.

(56) References Cited

U.S. PATENT DOCUMENTS

| | | | |
|---|---|---|---|
| 5,559,348 A | 9/1996 | Watabe et al. | |
| 5,796,125 A | 8/1998 | Matsudai et al. | |
| 5,844,275 A | 12/1998 | Kitamura et al. | |
| 6,194,290 B1 * | 2/2001 | Kub et al. ................ | 438/455 |
| 6,620,653 B2 | 9/2003 | Matsudai et al. | |
| 2002/0048855 A1 | 4/2002 | Matsudai et al. | |

FOREIGN PATENT DOCUMENTS

| | | |
|---|---|---|
| JP | 2-180074 A | 7/1990 |
| JP | 8-88357 A | 4/1996 |
| JP | 8-139319 A | 5/1996 |
| JP | 8-97411 A | 12/1996 |
| JP | 2002-083877 A | 3/2002 |
| JP | 2002-094033 A | 3/2002 |
| JP | 2002-110985 A | 4/2002 |
| JP | 2005-109226 A | 4/2005 |
| JP | 2006-5175 A | 1/2006 |

OTHER PUBLICATIONS

Stengl et al.; "A Model for the Silicon Wafer Bonding Process"; Japanese Journal of Applied Physics; Oct. 1989; pp. 1735-1741; vol. 28, No. 10.

(Continued)

*Primary Examiner* — Howard Weiss
*Assistant Examiner* — Steven H Rao
(74) *Attorney, Agent, or Firm* — Rossi, Kimms & McDowell LLP

(57) ABSTRACT

To enable driving at a high withstand voltage and a large current, increase latchup immunity, and reduce ON resistance per unit area in an IGBT, a trench constituted by an upper stage trench and a lower stage trench is formed over an entire wafer surface between an $n^+$ emitter region and a $p^+$ collector region, and the trench is filled with a trench-filling insulating film. Thus, a drift region for supporting the withstand voltage is folded in the depth direction of the wafer, thereby lengthening the effective drift length. An emitter-side field plate is buried in the trench-filling insulating film to block a lateral electric field generated on the emitter side of the trench-filling insulating film, and as a result, an electric field generated at a PN junction between an $n^-$ drift region and a p base region is reduced.

12 Claims, 43 Drawing Sheets

OTHER PUBLICATIONS

Himi et al.; "Silicon Wafer Direct Bonding without Hydrophilic Native Oxides"; Japanese Journal of Applied Physics; Jan. 1994; pp. 6-10; vol. 33 Part 1, No. 1A.

Kim et al.; "Behavior of Thermally Induced Defects in Heavily Boron-Doped Silicon Crystals"; Japanese Applied Physics; Mar. 2001; pp. 1370-1374; vol. 40, Part 1, No. 3A.

International search report issued in corresponding application: PCT/JP2005/018798, dated Dec. 27, 2005.

Notification of First Office Action dated Jun. 5, 2009 issued in corresponding Chinese 200580051823.6, pp. 1-4. Partial translation provided, pp. 1-3.

Notification of Second Office Action issued in corresponding Chinese Patent Application No. 200580051823.6 dated Oct. 16, 2009.

Notification of Reasons for Refusal issued in corresponding Japanese Patent Application No. 2004-180229 dated Sep. 7, 2010. Partial English translation provided.

* cited by examiner

DOPING CONCENTRATION (cm⁻³) of
DRIFT REGION

SOI TRENCH LATERAL IGBT

This is a continuation of International Application PCT/JP2005/018798 having an international filing date of 12 Oct. 2005. The disclosure of the International application, in its entirety, including the drawings, claims, and the specification thereof, is incorporated herein by reference.

BACKGROUND

A device combining a metal-oxide-semiconductor (MOS) transistor and a bipolar transistor is advantaged in that the configuration of a drive circuit is simple, as in a MOS element, and ON resistance is low due to the conductivity modulation of a withstand voltage part, as in a bipolar transistor. As a result of these advantages, such devices are gaining importance in fields requiring a high withstand voltage and a large power level. This type of device has a planar gate structure or a trench gate structure. In the planar gate structure, a gate electrode is provided on a substrate surface via a gate insulating film. In the trench gate structure, the gate electrode is buried in a trench formed in the substrate. A device having a trench gate structure is advantaged in that high channel density can be achieved, parasitic thyristors do not operate easily, and so on.

A conventional insulated-gate-bipolar transistor (IGBT) configuration will be described below with reference to the drawings. Note that in the specification and the drawings, the symbols n and p added to the names of semiconductor layers and regions indicate that the majority carrier of the corresponding layer or region is an electron and a hole, respectively. Further, when + is affixed to n or p, as in n+ and p+, this shows that the impurity concentration of the corresponding semiconductor layer or region is higher than the impurity concentration of a semiconductor layer or region to which + is not affixed. Further, when − is affixed to n or p, as in n− and p−, this shows that the impurity concentration of the corresponding semiconductor layer or region is lower than the impurity concentration of a semiconductor layer or region to which − is not affixed.

FIG. 49 is a view showing the sectional configuration of an IGBT manufactured using a conventional thick-film silicon-on-insulator (SOI) substrate. Here, the SOI substrate is configured such that an n− drift region 103 having high resistivity and serving as an active layer is laminated onto a support substrate 101 via an insulating layer 102. A p base region 104 is provided on a part of a surface layer of the n− drift region 103. An n+ emitter region 106 and a p+ low resistance region 105 that contacts the n+ emitter region 106 are provided on a part of the surface layer of the p base region 104. A part of the p+ low resistance region 105 occupies a part below the n+ emitter region 106. Further, an n buffer region 111 is provided on a part of the surface layer of the n− drift region 103 spaced from the p base region 104. The resistivity of the n buffer region 111 is lower than the resistivity of the n− drift region 103. A p+ collector region 112 is provided on a part of the surface layer of the n buffer region 111. An emitter electrode 107 contacts both the p+ low resistance region 105 and the n+ emitter region 106. A gate electrode 108 is provided on the surface of the p base region 104, which is sandwiched between the n− drift region 103 and the n+ emitter region 106, via an insulating film 109. A collector electrode 110 contacts the p+ collector region 112.

In the IGBT configured in FIG. 49, a PNP bipolar transistor is constituted by the p+ collector region 112, an n region constituted by the n buffer region 111 and the n− drift region 103, and a p region constituted by the p base region 104 and the p+ low resistance region 105. Further, an NPN bipolar transistor is constituted by the n+ emitter region 106, the p base region 104, and the n− drift region 103. The PNP bipolar transistor and NPN bipolar transistor together form a parasitic thyristor. To avoid latchup caused by the parasitic thyristor, an upper limit is set in relation to an ON current. To increase the upper limit value of the ON current, measures can be taken to ensure that the NPN bipolar transistor is not activated. For this purpose, the resistance of a current path passing below the n+ emitter region 106 from a channel end side to the p+ low resistance region 105 must be suppressed. A method of reducing the resistance of the current path through ion implantation is well known. Further, in a well-known method of forming a trench emitter electrode that is capable of self-alignment with a gate electrode, uncertainty when forming the p+ low resistance region 105 is removed through mask alignment, and the length of the current path is reduced to a minimum.

A structure in which part of the carrier that flows into the n− drift region 103 from the p+ collector region 112 is caused to arrive at the p+ low resistance region 105 without passing through the current path when the element is in an ON state is also well known. In the IGBT shown in FIG. 49, an electric field is concentrated on the interface between the n− drift region 103 and the p base region 104 in the vicinity of the wafer surface, and the interface between the n− drift region 103 and the n buffer region 111 in the vicinity of the wafer surface. To reduce this electric field concentration, the emitter electrode 107 and collector electrode 110 can be extended to cover these interfaces via the insulating film 109 as field plates. In a well-known structure employed when a higher withstand voltage is required or wiring such as a power line exists on the drift region, a capacitively coupled field plate is provided on the upper surface of the drift region on the wafer surface or in the interior of the drift region.

In a conventional device combining a MOS transistor and a bipolar transistor, such as that described above, a voltage is supported in the direction of the wafer surface, and therefore the dimensions of a unit device increase in proportion with the withstand voltage design value. Therefore, a device used for high-withstand voltage, large-current applications is disadvantaged in that the chip area increases. To reduce the surface area of the drift region on the wafer surface in a lateral MOS transistor, a configuration in which a trench is formed in the drift region and the trench is filled with a silicon oxide film having a greater breakdown electric field than silicon has been proposed for example in Japanese Unexamined Patent Application Publication H8-97411. According to this proposal, as shown in FIG. 50, an effective drift length Leff corresponds to a length obtained by adding together a distance $L_P$ from an interface between a p well region 204 formed with a channel and an n well region 203 that serves as the drift region to an oxide film 217 buried in the trench, a trench depth $L_T$, a trench width $L_B$, and the trench depth $L_T$ again. Meanwhile, a distance $L_D$ from the interface between the p well region 204 and n well region 203 on the wafer surface to a drain region 212 corresponds to a length obtained by adding together $L_P$ and $L_B$. Accordingly, Leff can be made longer than when the buried oxide film 217 is not provided, and therefore an ON resistance RonA is reduced in comparison with a device having an identical withstand voltage. Here, Ron is the ON resistance per unit area, and A is the surface area. In other words, a lateral device having an equal withstand voltage and an equal ON current to a conventional device and a smaller device pitch than a conventional device is obtained.

Further, in a lateral IGBT having an SOI (silicon on insulator) structure, a configuration in which a trench is formed in an n-type active layer and a high-density n-type bypass layer is provided partially below the trench has been proposed for example in Japanese Unexamined Patent Application Publication H8-88357 (FIGS. 1 to 8) (hereafter the second reference). According to this proposal, a hole current that flows into a source electrode is reduced by the trench, and an electron current flows through the bypass layer. Therefore, electron current accumulation on the source side increases, leading to a reduction in the ON voltage.

However, various problems exist in the IGBT disclosed in the second reference. For example, when a wafer is realized by adhering a SOI structure, two wafers must be adhered with positioning precision in the order of µm to ensure that the bypass layer is positioned directly beneath the trench, and this is unfavorable in terms of manufacture. Further, with the layout shown in FIG. 2 or 3 of the second reference, the withstand voltage is determined according to the length of the n-type active layer on the wafer surface, and therefore the cell pitch of the device cannot be shortened. As a result, the ON resistance per unit area cannot be reduced. Further, when the sectional configuration shown in FIG. 8 of the second reference is provided with the layout shown in FIG. 4 thereof, a low resistance region exists on the periphery of the trench, and therefore the withstand voltage is determined according to the length of the n-type active layer on the wafer surface excluding the trench. Hence, the cell pitch of the device cannot be shortened, and as a result, the ON resistance per unit area cannot be reduced. Further, with a device having the layout shown in FIG. 4 and the sectional configuration shown in FIG. 6 of the second reference, a hole passage is not formed beneath the trench 17, and therefore conductivity modulation on the gate side is not performed such that the benefits of the IGBT are impaired. If the layout shown in FIG. 2 of this publication is employed to maintain gate side conductivity modulation, the device pitch is determined according to the length of a surface drift region 3, and therefore the pitch cannot be shortened. Furthermore, with the sectional configuration shown in FIG. 5 of the second reference, the distance of the active layer between the trench bottom and the bypass layer is determined in accordance with ion implantation energy, and therefore this part cannot be increased in thickness, thereby limiting tradeoff with the withstand voltage.

Accordingly, there remains a need for lateral IGBT that enables driving at a high withstand voltage and a large current, and has high latchup immunity and low ON resistance per unit area. The present invention addresses this need.

SUMMARY OF THE INVENTION

The present invention relates to a SOI lateral IGBT, which is a power device that combines a lateral MOS transistor and a bipolar transistor, and in particular to a lateral IGBT that has low ON resistance per unit area and high short circuit immunity.

According to one aspect of the invention, the SOI trench lateral IGBT comprises a support substrate, a semiconductor layer of a first conductivity type, a first semiconductor region of the first conductivity type, a second semiconductor region of the first conductivity type, a third semiconductor region of a second conductivity type, a gate electrode, an emitter region of the first conductivity type, a low resistance region of the second conductivity type, a high conductivity region of the second conductivity type, a fourth semiconductor region of the first conductivity type, a collector region of the second conductivity type, a trench, a trench-filling insulating film, an emitter electrode, and a collector electrode.

The semiconductor layer is on the support substrate via an insulating layer. The first semiconductor region, which has a higher resistivity than the semiconductor layer, is on the semiconductor layer. The second semiconductor region, which has a lower resistivity than the first semiconductor region, is on the first semiconductor region. The third semiconductor region is on the first semiconductor region in contact with the first semiconductor region and the second semiconductor region. The gate electrode is on the third semiconductor region via a gate insulating film. The emitter region is in the third semiconductor region. The low resistance region is in the third semiconductor region below the emitter region. The high conductivity region is in the third semiconductor region adjacent to the emitter region. The fourth semiconductor region, which has a lower resistivity than the first semiconductor region, is on the first semiconductor region and spaced from the second semiconductor region and the third semiconductor region. The collector region is in the fourth semiconductor region. The trench can be between the second or third semiconductor region and the fourth semiconductor region. The trench-filling insulating film fills the trench. The emitter electrode contacts the emitter region and the high conductivity region. The collector electrode contacts the collector region.

The trench can be spaced from the third semiconductor region or the fourth semiconductor region, or both.

The SOI trench lateral IGBT can further include an emitter-side conductive region having a floating potential buried in an upper half portion of the trench-filling insulating film in the vicinity of the third semiconductor region. The SOI trench lateral IGBT can further include a collector-side conductive region buried in the upper half portion of the trench-filling insulating film in the vicinity of the fourth semiconductor region, and the collector electrode can be electrically connected to the collector-side conductive region.

The emitter-side conductive region can be buried in the trench-filling insulating film inside the trench in the vicinity of a pn junction between the third semiconductor region and the first semiconductor region. The collector-side conductive region can be buried in the trench-filling insulating film inside the trench in the vicinity of an interface between the fourth semiconductor region and the first semiconductor region.

The gate insulating film, the gate electrode, the third semiconductor region, the low resistance region, the emitter region, and the high conductivity region each can be provided on one side of the trench-filling insulating film, and the emitter electrode can electrically connect the emitter region and the high conductivity region to each other.

According to another aspect of the invention, the SOI trench lateral IGBT comprises the support substrate, the semiconductor layer, the first semiconductor region, the third semiconductor region in contact with the first semiconductor region, a gate trench, a gate electrode, the emitter region, a low resistance region of the second conductivity type, the fourth semiconductor region, the collector region, a trench between the third semiconductor region and the fourth semiconductor region, the trench-filling insulating film, the emitter-side conductive region, an emitter electrode, and the collector electrode contacting the collector region.

The gate trench can extend through the third semiconductor region and reach the first semiconductor region. The gate electrode is inside the gate trench via a gate insulating film. The emitter region in the third semiconductor region is in contact with the gate trench. The low resistance region is in the third semiconductor region adjacent to the emitter region. The fourth semiconductor region can be spaced from the third semiconductor region or the fourth semiconductor region, or both. The emitter electrode contacts the emitter region and the low resistance region.

The emitter-side conductive region can be buried in the trench-filling insulating film inside the trench in the vicinity of a pn junction between the third semiconductor region and the first semiconductor region. The collector-side conductive region can be buried in the trench-filling insulating film inside the trench in the vicinity of an interface between the fourth semiconductor region and the first semiconductor region The SOI trench lateral IGBT also can include the collector-side conductive region buried in the upper half portion of the trench-filling insulating film in the vicinity of the fourth semiconductor region, and the collector electrode can be electrically connected to the collector-side conductive region.

The gate trench, the gate insulating film, the gate electrode, the third semiconductor region, the low resistance region, and the emitter region each can be provided on one side of the trench-filling insulating film, and the emitter electrode can electrically connect the emitter region and the high conductivity region to each other.

Moreover, in each embodiment above, the trench can comprise an upper stage trench and a lower stage trench, the lower stage trench extending below a bottom of the upper stage trench and having a narrower width than the upper stage trench.

DETAILED DESCRIPTION

Preferred embodiments of an IGBT according to the present invention will be described in detail below with reference to the drawings. Note that in the following description of the embodiments and all of the attached drawings, identical reference symbols have been allocated to identical constitutions, and a duplicate description thereof has been omitted.

Figure 1:
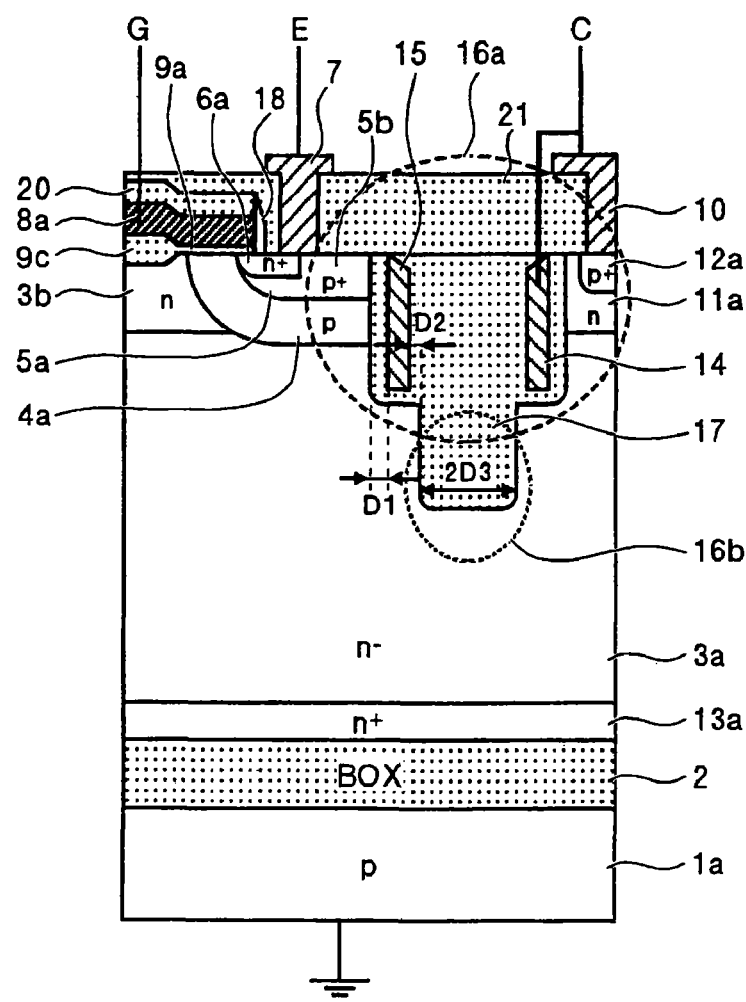
FIG. 1 is a sectional view showing the configuration of an IGBT according to a first embodiment.
Figure 2:
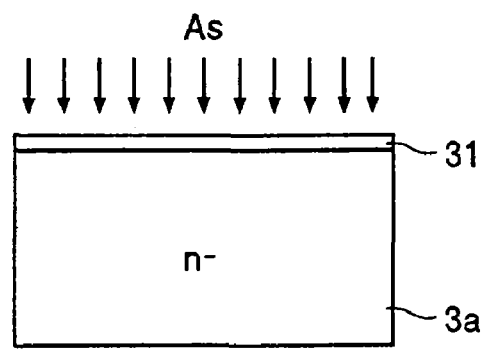
FIG. 2 is a sectional view showing the manufacture of a device wafer of a SOI wafer used to manufacture the IGBT according to the first embodiment, in which a screen oxide film is formed on the surface of a semiconductor wafer serving as a drift region, and arsenic ions are implanted.

FIG. 1 is a sectional view showing an IGBT according to the first embodiment. Referring to FIG. 1, in the first embodiment, an n channel IGBT is manufactured using a SOI substrate. The SOI substrate is manufactured by laminating an insulating layer 2 formed from an oxide film or the like, an n+ minority carrier canceling layer 13a, and an n− drift region 3a on a p support substrate 1a in sequence. The resistivity of the n− drift region 3a is higher than the resistivity of the n+ minority carrier canceling layer 13a. Hence, the n+ minority carrier canceling layer 13a exhibits a gettering effect in relation to metallic ion contamination, and therefore doubles as a getter layer. The n− drift region 3a corresponds to a first semiconductor region, and the n+ minority carrier canceling layer 13a corresponds to a semiconductor layer provided on a support substrate via an insulating layer.

An n well region 3b is provided on a part of the surface layer of the n− drift region 3a. The n well region 3b is doped to a higher concentration than the n− drift region 3a, and has a lower resistivity than the n− drift region 3a. Thus, increases in the resistance of the n well region 3b caused by a JFET (junction type FET) effect with a p base region 4a to be described below are suppressed. The p base region 4a is provided in contact with the n− drift region 3a and n well region 3b on a part of the surface layer of the n− drift region 3a. The n well region 3b and p base region 4a correspond to a second semiconductor region and a third semiconductor region, respectively. A gate electrode 8a is provided on a part of the p base region 4a and the surface of the n well region 3b via a gate insulating film 9a. The gate electrode 8a is formed from conductive polysilicon, for example. In the drawing, a thick insulating film 9c is formed on the surface of the n well region 3b to reduce capacitance, and the gate electrode 8a is provided thereon. A p+ low resistance region 5a and a p+ base contact region 5b are provided on another part of the p base region 4a. An n+ emitter region 6a is provided on a part of the p+ low resistance region 5a. The n+ emitter region 6a is provided in alignment with a p base region-side end portion (in FIG. 1, an end portion on the n+ emitter region 6a) of the gate electrode 8a. The gate electrode 8a can be provided on the surface of the p base region 4a between the n well region 3b and n+ emitter region 6a, and does not necessarily have to be provided on the n well region 3b.

When a gate voltage exceeds a threshold voltage, a channel is formed on the interface between the gate insulating layer 9a and the p base region 4a between the n+ emitter region 6a and n well region 3b. In the p base region 4a, the p+ low resistance region 5a is formed to occupy the lower side of the n+ emitter region 6a, and the p+ base contact region 5b is provided adjacent to the n+ emitter region 6a. The p+ base contact region 5b corresponds to a high conductivity region. The p+ low resistance region 5a is preferably formed to occupy the lower side of the n+ emitter region 6a within a range that does not affect the threshold voltage, as in this embodiment, but can be formed in a part of the lower side of the n+ emitter region 6a.

A gate side wall spacer region 18 formed from an oxide film or a nitride film is provided on the outside of the p base region-side end portion of the gate electrode 8a in contact with an end portion thereof. Using the gate side wall spacer region 18, the p+ low resistance region 5a is formed so as not to enter the region in which the channel is formed. Thus, the p+ low resistance region 5a does not affect the threshold of the gate voltage for forming the channel.

Further, an n buffer region 11a is provided on a part of the surface layer of the n− drift region 3a at a remove from the n well region 3b and p base region 4a. The n buffer region 11a is doped to a higher concentration than the n− drift region 3a, and has a lower resistivity than the n− drift region 3a. The n buffer region 11a corresponds to a fourth semiconductor region, and together with the n− drift region 3a and n well region 3b forms a drift region for holding the withstand voltage of the device. Accordingly, this device is a punch through-type IGBT having the n buffer region 11a.

A p+ collector region 12a is provided in a part of the n buffer region 11a and removed from the n− drift region 3a by the n buffer region 11a. The p+ collector region 12a serves as a carrier implantation region for performing conductivity modulation. The n buffer region 11a controls a conductivity modulation carrier amount implanted from the p+ collector region 12a, which is related to tradeoff between element ON resistance and turnoff loss.

An upper stage trench 16a is formed between the n well region 3b and p base region 4a and the n buffer region 11a from the SOI substrate surface to the n− drift region 3a up to a position that is deeper than the p base region 4a. A lower stage trench 16b having a narrower width than the upper stage trench 16a is formed to an even deeper position from the bottom of the upper stage trench 16a. The upper stage trench 16a and lower stage trench 16b are filled with a trench-filling insulating film 17 such as an oxide film. The trench-filling insulating film 17 contacts the n– drift region 3a, p base region 4a, and p+ base contact region 5b on an emitter-side side wall of the upper stage trench 16a.

An emitter-side field plate 15 formed from conductive polysilicon or the like is buried in the trench-filling insulating film 17 near the emitter-side side wall of the upper stage trench 16a in an electrically floating state. The emitter-side field plate 15 can be provided vertically along a PN junction surface formed by the p base region 4a and the n– drift region 3a. The emitter-side field plate 15 corresponds to an emitter-side conductive region.

Further, the trench-filling insulating film 17 contacts the n– drift region 3a and the n buffer region 11a on a collector-side side wall of the upper stage trench 16a. A collector-side field plate 14 formed from conductive polysilicon or the like is provided in the trench-filling insulating film 17 near the collector-side side wall of the upper stage trench 16a. The collector-side field plate 14 corresponds to a collector-side conductive region that is electrically connected to a collector electrode 10, which is provided in contact with the p+ collector region 12a via internal wiring or external wiring, and set at an identical potential to the collector electrode 10.

The collector-side field plate 14 prevents depletion of the interface between the upper stage trench 16a and the n– drift region 3a and n buffer region 11a, and thus contributes to an increase in the withstand voltage of the device. In other words, by providing the collector-side field plate 14, the withstand voltage of the device is increased. The collector-side field plate 14 can be provided vertically along the interface with the n– drift region 3a and the n buffer region 11a.

An emitter electrode 7 is provided in contact with both the n+ emitter region 6a and p+ base contact region 5b so as to short the p+ base contact region 5b and n+ emitter region 6a. In FIG. 1, a reference numeral 20 denotes an insulating film cover layer formed from an oxide film or the like, which is provided to reduce plasma etching damage to the gate insulating film 9a during manufacture, and a reference numeral 21 denotes an interlayer insulating film.

With the configuration described above, a gate structure forming a bypass structure for bypassing a conductivity modulation carrier is achieved. More specifically, a part of a carrier implanted from the p+ collector region 12a passes through the interface between the p base region 4a and n– drift region 3a, the p base region 4a, and the p+ base contact region 5b to reach the emitter electrode 7.

Another carrier implanted from the p+ collector region 12a passes through the n well region 3b, a surface channel on the interface between the p base region 4a and gate insulating film 9a, the p+ low resistance region 5a, and the p+ base contact region 5b to reach the emitter electrode 7. With this bypass structure, latchup is less likely to occur in the device, and hence an improvement in latchup immunity is achieved.

Figure 3:
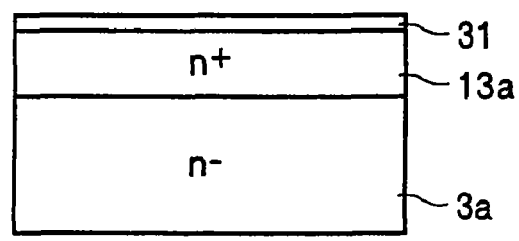
FIG. 3 is a sectional view showing a continuation of the state shown in FIG. 2, in which a minority carrier canceling layer is formed by arsenic ion implantation in the surface of the semiconductor wafer.
Figure 4:
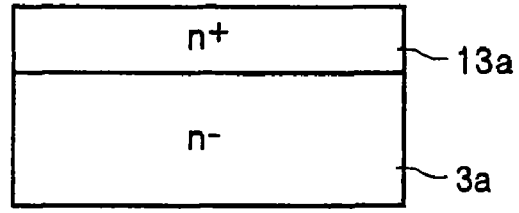
FIG. 4 is a sectional view showing a continuation of the state shown in FIG. 3, in which the screen oxide film is removed to complete formation of the device wafer constituted by the drift region and the minority carrier canceling layer.

Next, a manufacturing process for the device configured as shown in FIG. 1 will be described with reference to FIGS. 2-8. First, referring to FIG. 2, a screen oxide film 31 is formed on the surface of a wafer constituted by an n– semiconductor that is to serve as the n– drift region 3a. Referring to FIG. 3, As (arsenic) serving as an n-type impurity is then thermally diffused from above through ion implantation such that the n+ minority carrier canceling layer 13a is formed on the wafer surface. Then, referring to FIG. 4, the screen oxide film 31 is removed. At this point, a device wafer is completed.

Figure 5:
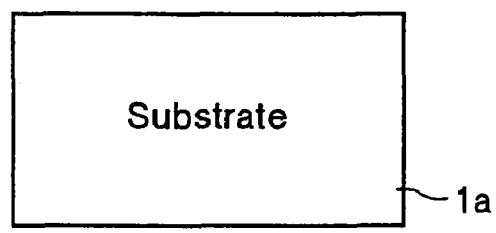
FIG. 5 is a sectional view showing the manufacture of a handle wafer of the SOI wafer used to manufacture the IGBT according to the first embodiment, in which a support substrate of the handle wafer is prepared.
Figure 6:
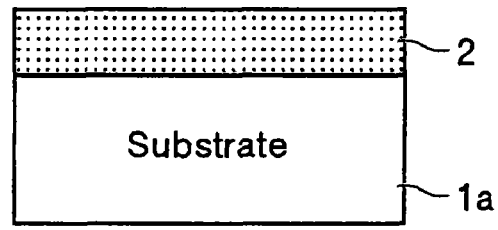
FIG. 6 is a sectional view showing a continuation of the state shown in FIG. 5, in which an insulating layer is formed on the surface of the support substrate of the handle wafer to complete formation of the handle wafer.
Figure 7:
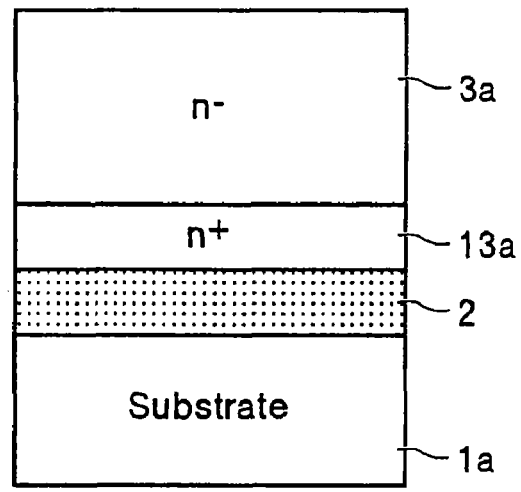
FIG. 7 is a sectional view showing a continuation of the states shown in FIGS. 4 and 6, in which the device wafer and handle wafer are integrated to form the SOI wafer.
Figure 8:
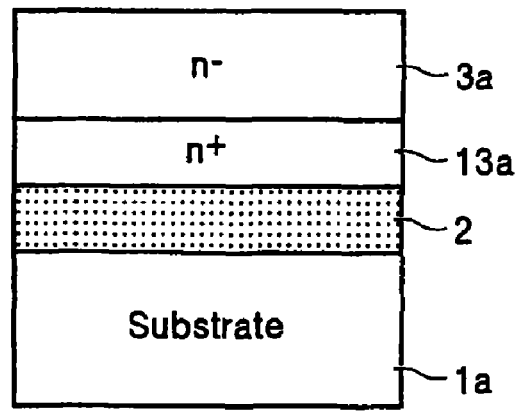
FIG. 8 is a sectional view showing a continuation of the state shown in FIG. 7, in which the drift region of the integrated SOI wafer is polished to a predetermined thickness, thereby completing manufacture of the SOI wafer used to manufacture the IGBT according to the first embodiment.

Meanwhile, referring to FIG. 5, the p support substrate 1a is provided. Then, referring to FIG. 6, the insulating layer 2 is formed on the surface of the p support substrate 1a using an oxide film or the like. Thus, a handle wafer is formed. Next, referring to FIG. 7, the surface of the insulating layer 2 on the handle wafer and the surface of the n+ minority carrier canceling layer 13a on the device wafer are adhered to each other. At this time, the device wafer and handle wafer are integrated through bonding via a natural oxide film on the surface of the device wafer. Then, referring to FIG. 8, the n– drift region 3a of the integrated SOI wafer is polished to a predetermined thickness. At this point, the SOI wafer is completed.

Although not shown in the drawings, the manufacturing process is continued by performing ion implantation using phosphorous or the like to form an n diffusion layer serving as the n well region 3b and the n buffer region 11a on the surface of the SOI wafer, or in other words the polished surface of the n– drift region 3a. Next, ion implantation using boron or the like and thermal diffusion thereof are performed to form the p base region 4a. Next, a trench etching hard mask is formed, whereupon the lower stage trench 16b is formed by trench etching. After removing trench etching damage through sacrificial oxidation or the like, an insulating film such as an oxide film is deposited on the entire wafer surface. After planarizing the surface of the deposited insulating film using CMP, a trench etching hard mask is formed, and by etching the upper portion of the two side walls of the lower stage trench 16b, the upper stage trench 16a is formed. After removing trench etching damage through sacrificial oxidation or the like, an insulating film such as an oxide film is deposited on the side walls and bottom surface of the upper stage trench 16a. Next, a conductive polysilicon film is deposited on the upper stage trench 16a.

After etching back the deposited conductive polysilicon film, an insulating film such as an oxide film is deposited on the entire wafer surface and planarized by CMP. Next, the wafer surface is exposed leaving the insulating film on the trench 16a and the trench 16b intact. A LOCOS oxide film serving as the insulating film 9c is then formed on the exposed wafer surface using a nitride film as a mask. Next, an oxide film serving as the gate insulating film 9a is cultivated on the insulating film 9c. Doped polysilicon serving as the gate electrode 8a is then deposited on the gate insulating film 9a and the insulating film 9c at a thickness of 300 to 400 nm.

An oxide film or the like serving as the insulating film cover layer 20 is then deposited thereon at a thickness of 300 to 500 nm. By providing the insulating film cover layer 20 in this embodiment, the doped polysilicon forming the gate electrode 8a can be reduced in thickness to between 300 and 400 nm, and standardization with the gate polysilicon of an LV (low voltage) CMOS device can be achieved easily. Next, a gate stack structure constituted by the insulating film cover layer 20, the gate electrode 8a, and the gate insulating film 9a is formed by RIE (reverse ion etching). At this time, the oxide film or the like serving as the insulating film cover layer 20 is provided, and therefore plasma etching damage to the gate insulating film 9a is reduced.

After performing shadow oxidation, ion implantation using arsenic or the like is performed through self-alignment (a self-alignment technique) to form the n+ emitter region 6a. Next, the gate side wall spacer region 18 is formed on the side face of the gate stack structure. At this time, the thickness of the gate side wall spacer region 18 must be set at approximately 150 to 200 nm so that the threshold of the gate voltage for forming the channel is not affected by offset in the lateral range of boron ions implanted during a subsequent boron ion implantation process.

Next, boron ion implantation is performed at a high energy of 70 to 90 keV and a dose of $1\times10^{15}$ to $3\times10^{15}$ cm$^{-2}$, for example, to form the p+ low resistance region 5a below the n+ emitter region 6a. At this time, boron ion implantation into the channel region is prevented by the insulating film cover layer 20 and the gate electrode 8a, and therefore the channel region is protected. Next, the p+ base contact region 5b and the p+ collector region 12a are formed by boron ion implantation. Next, the interlayer insulating film 21 is deposited on the entire wafer surface, and the upper surface thereof is planarized using CMP (chemical-mechanical polishing). A contact hole is then opened in the planarized interlayer insulating film 21, whereupon the emitter electrode 7 and collector electrode 10 are formed through metal sputtering. At this point, a front end process is complete.

Incidentally, reports such as the following exist in relation to manufacture of the SOI wafer described above. Firstly, a report exists in relation to the suppression of OSF (oxide-induced stacking faults) and BMD (bulk micro defects). The balance between atomic air holes formed during wafer withdrawal using the Czochralski method and interstitial atoms is lost when boron ions are implanted at a high dose, for example. Hence, when annealing processing is first performed following ion implantation at a temperature of 900° C. or less, many OSFs and BMDs occur. To counter this problem, Jeong-Min KIM et al have reported, in "Behavior of Thermally Induced Defects in Heavily Boron-Doped Silicon Crystals", Japanese Journal of Applied Physics, March 2001, Volume 40, Section 1, Number 3A, p. 1370 to 1374, that the occurrence of OSFs and BMDs can be suppressed by performing initial annealing processing at a high temperature (1050° C.).

Further, the following has been reported in relation to wafer bonding. When manufacturing an adhered SOI wafer, the surfaces of the wafers to be adhered are mirror-quality surfaces required for bonding the wafers to each other. In a known mechanism for bonding silicon wafers, the wafers are integrated via $H_2O$ adsorbed to the "Si—OH—" on the wafer surfaces. R. STENGL et al have reported, in "A Model for the Silicon Wafer Bonding Process", Japanese Journal of Applied Physics, October 1989, Volume 28, Number 10, p. 1735 to 1741, that water molecules form a tetramer cluster when [wafers are] heated to 200° C. or more, and when the wafers are heated to 700° C. or more, the water cluster evaporates such that the wafers are bonded to each other via "Si—O—Si". R. STENGL et al also report that when the wafers are heated at 1100° C., the insulating layer (filling oxide film layer) of the SOI wafer reflows, enabling an increase in the bonding strength of the wafers. Wafer bonding is also possible when a hydroxyl group ("—OH") exists on the mirror-quality wafer surface prior to bonding. In "Silicon Wafer Direct Bonding without Hydrophilic Native Oxides", Japanese Journal of Applied Physics, January 1994, Volume 33, Section 1, Number 1A, p. 6 to 10, Hiroaki HIMI et al report a method of bonding a device wafer to a handle wafer formed with an insulating layer after submerging the device wafer in deionized water immediately after processing the device wafer using highly concentrated fluorine, and then replacing high surface density "—F" adhered to the surface of the device wafer with "—OH".

In this embodiment, the three reports described above can be applied when manufacturing the SOI wafer. According to the first embodiment described above, the device pitch of the configuration shown in FIG. 1 can be suppressed to no more than 12 μm and the thickness of the n− drift region 3a can be suppressed to no more than 20 μm while securing a withstand voltage in the 200V class, and therefore the device pitch of the configuration shown in FIG. 1 can be reduced to at least half the cell pitch (25 μm) of the conventional device shown in FIG. 49. Further, the current driving capability of the unit cell device configured as shown in FIG. 1 is made approximately identical to the current driving capability of a conventional lateral device by optimizing the device structure and the manufacturing process. Hence, in the device configured as shown in FIG. 1, the ON resistance per unit area is approximately 250 mΩ×mm², i.e., half the ON resistance (500 mΩ×mm²) of a conventional device.

Figure 9:
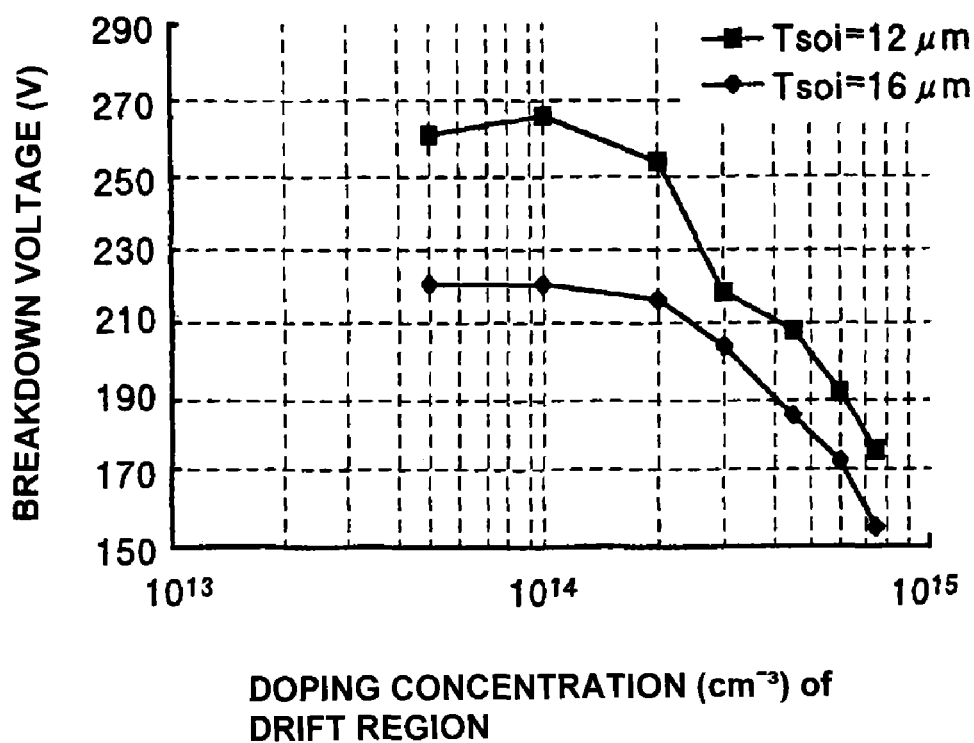
FIG. 9 is a characteristic diagram showing an example of a relationship between a breakdown voltage, i.e., an OFF withstand voltage of the IGBT according to the first embodiment, and the doping concentration of the drift region.
Figure 10:
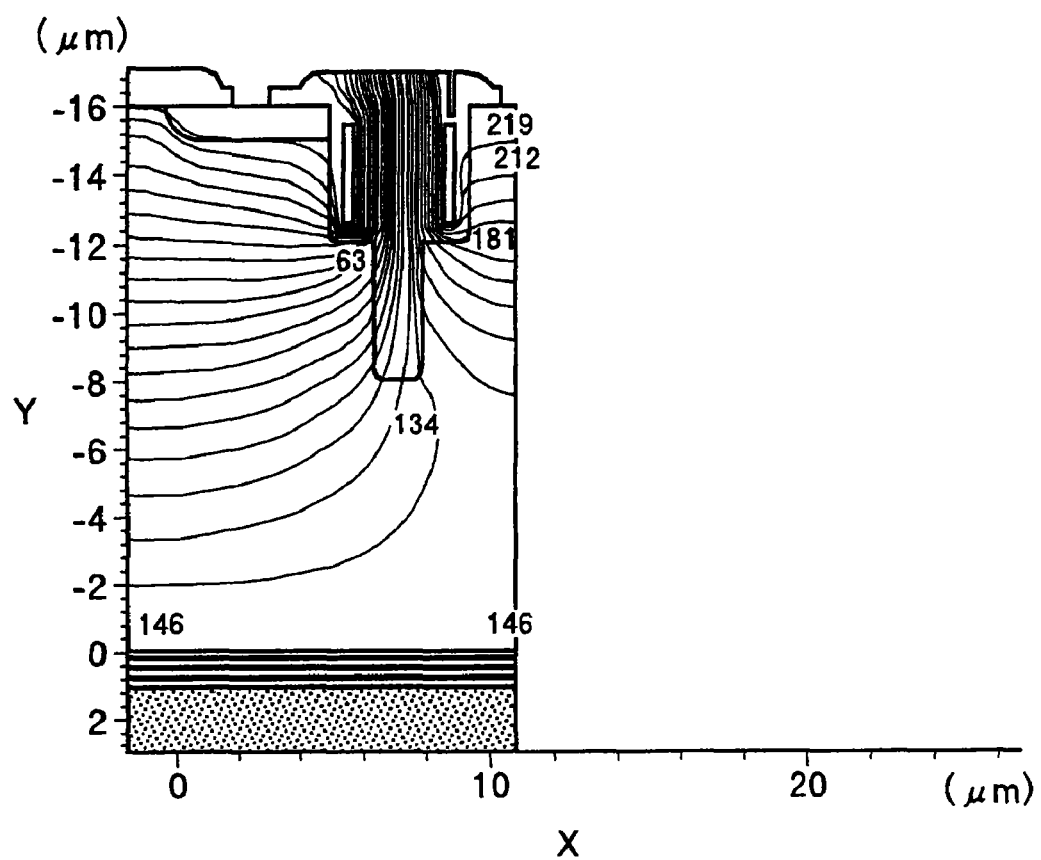
FIG. 10 is a potential distribution diagram showing an example of the distribution of an electrostatic potential during breakdown of the IGBT according to the first embodiment.

As an example, FIG. 9 shows the relationship between the OFF withstand voltage (breakdown voltage) of the device and the doping concentration of the n− drift region 3a when D1, D2 and 2D3 in the configuration shown in FIG. 1 are set at 0.5 μm, 0.6 μm, and 1.8 μm, respectively, and the thickness of the n− drift region 3a is set at 12 μm or 16 μm. Further, FIG. 10 shows the electrostatic potential distribution during a breakdown when D1, D2 and 2D3 in the configuration shown in FIG. 1 are set at 0.5 μm, 0.6 μm, and 1.8 μm, respectively, the thickness of the n− drift region 3a is set at 16 μm, and the doping concentration of the n− drift region 3a is set at $3\times10^{14}$ $cm^{-3}$. In FIG. 10, X denotes the lateral direction dimension of the device, and Y denotes the vertical direction dimension of the device.

Figure 11:
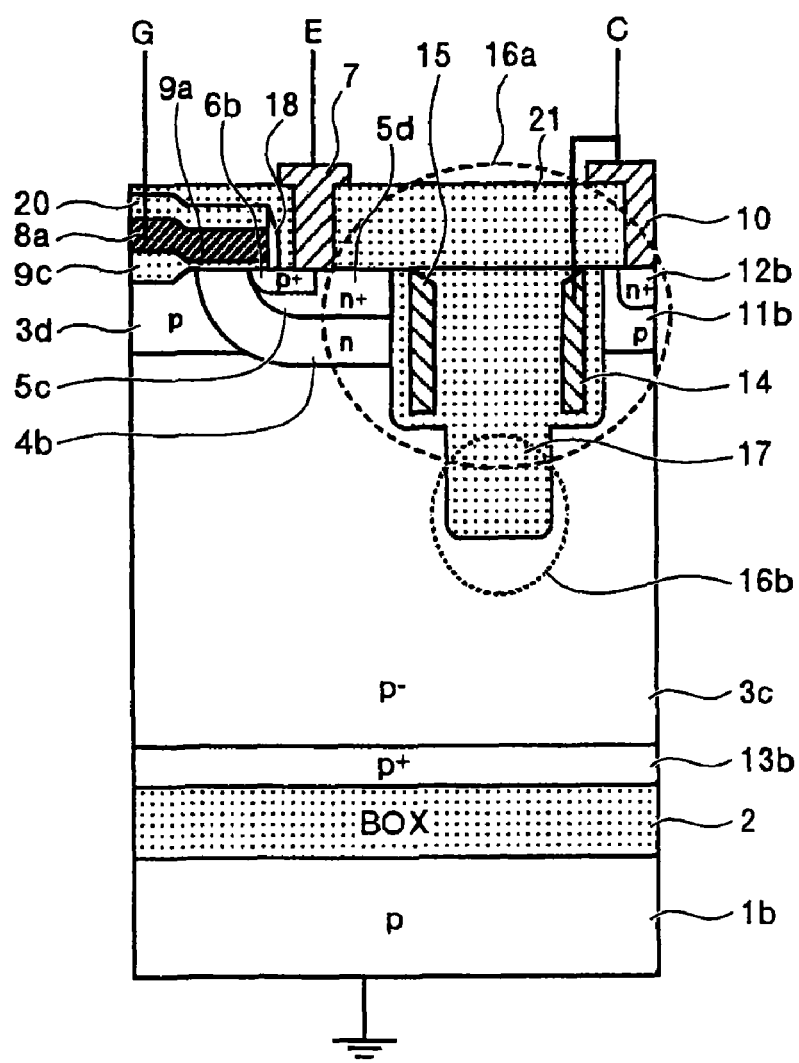
FIG. 11 is a sectional view showing the configuration of an IGBT in which the polarities of the configuration shown in FIG. 1 are reversed.

FIG. 11 shows a p channel IGBT obtained by reversing the polarities of the n channel IGBT configured as shown in FIG. 1. In this p channel IGBT, the p support substrate 1a, n+ minority carrier canceling layer 13a, n− drift region 3a, n well region 3b, and p base region 4a in the above description of the first embodiment are replaced by an n support substrate 1b, a p+ minority carrier canceling layer 13b, a p− drift region 3c, a p well region 3d, and an n base region 4b, respectively.

Further, the p+ low resistance region 5a, p+ base contact region 5b, n+ emitter region 6a, n buffer region 11a, and p+ collector region 12a are replaced by an n+ low resistance region 5c, an n+ base contact region 5d, a p+ emitter region 6b, a p buffer region 11b, and an n+ collector region 12b, respectively. Further, in relation to the types of implanted ions in the manufacturing process, n-type impurities and p-type impurities are switched.

Figure 12:
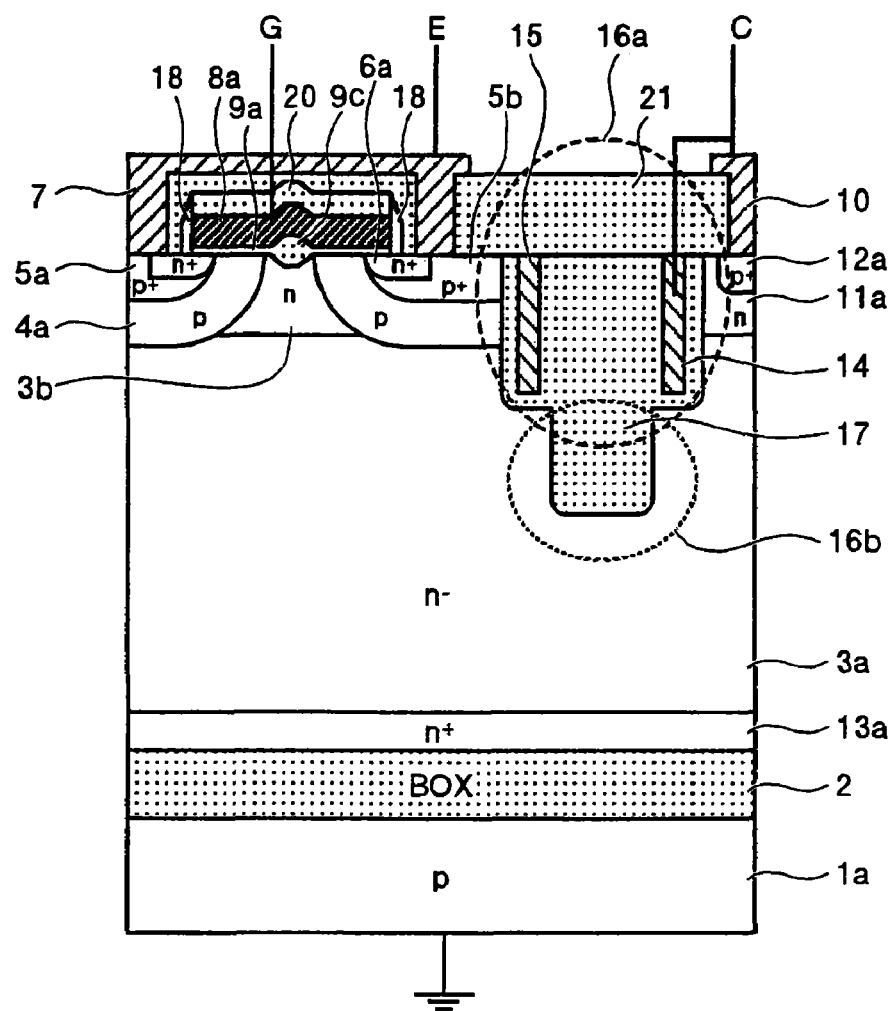
FIG. 12 is a sectional view showing the configuration of an IGBT according to a second embodiment.
Figure 13:
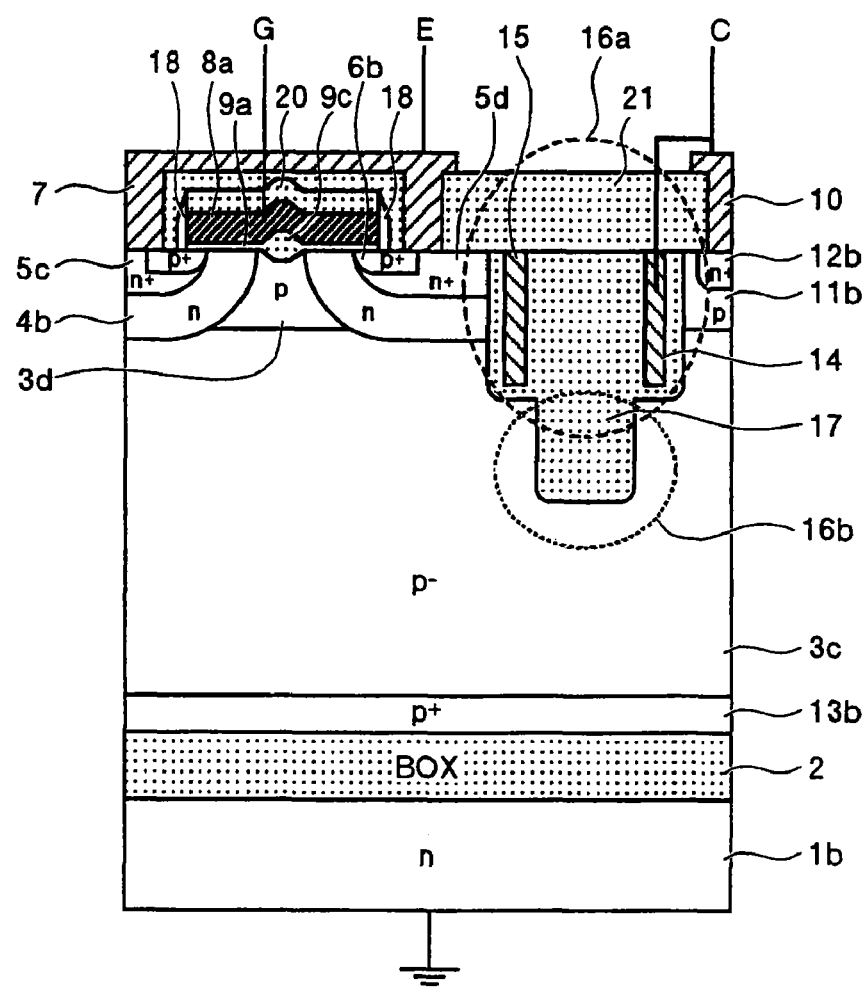
FIG. 13 is a sectional view showing the configuration of an IGBT in which the polarities of the configuration shown in FIG. 12 are reversed.

FIGS. 12 and 13 are sectional views respectively showing an n channel IGBT and a p channel IGBT according to a second embodiment. Referring to FIGS. 12 and 13, the IGBT of the second embodiment differs from the IGBT of the first embodiment in that each drift region 3a, 3c is provided with a plurality of channels (two in the illustrated example) to achieve a high current capability. More specifically, in the case of the n channel IGBT shown in FIG. 12, a plurality of, for example two, p base regions 4a are provided on the emitter side of the trench-filling insulating film 17 so as to sandwich the n well region 3b. The p+ low resistance region 5a, p+ base contact region 5b, and n+ emitter region 6a are provided in each p base region 4a. A planar gate structure constituted by the gate insulating film 9a and the gate electrode 8a is provided on each p base region 4a between the n+ emitter region 6a and the n well region 3b, and a channel is formed on the interface between each p base region 4a and the corresponding gate insulating film 9a. Further, the adjacent n+ emitter regions 6a and p+ base contact regions 5b are electrically connected to each other by the emitter electrode 7. All other configurations are identical to those of the IGBT according to the first embodiment, and therefore description thereof has been omitted. In the case of the p channel IGBT shown in FIG. 13, the polarities are switched in a similar manner to the first embodiment.

Figure 14:
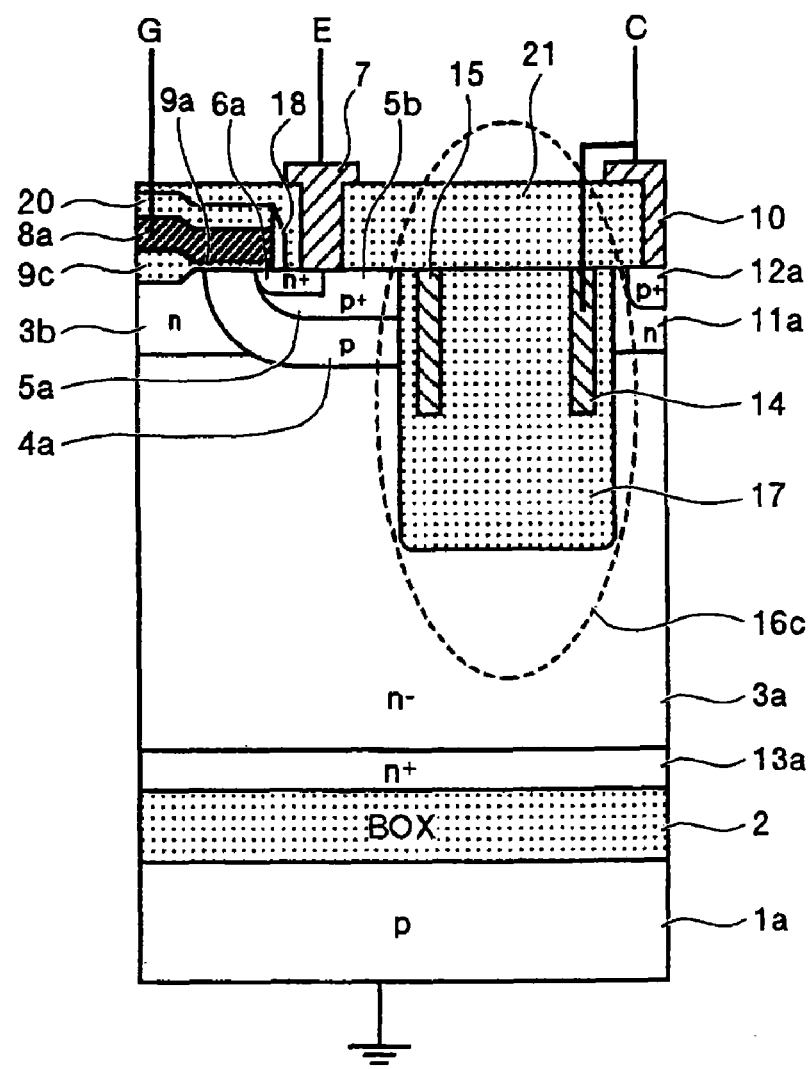
FIG. 14 is a sectional view showing the configuration of an IGBT according to a third embodiment.
Figure 15:
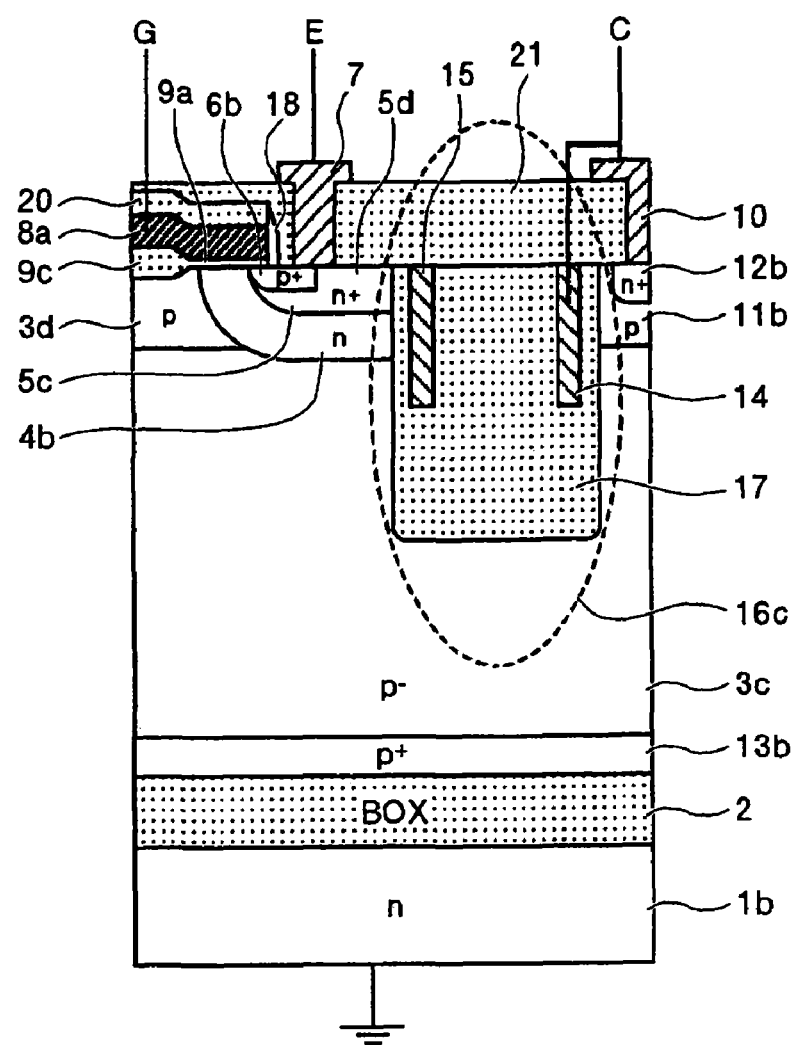
FIG. 15 is a sectional view showing the configuration of an IGBT in which the polarities of the configuration shown in FIG. 14 are reversed.

FIGS. 14 and 15 are sectional views respectively showing an n channel IGBT and a p channel IGBT according to a third embodiment. Referring to FIGS. 14 and 15, the respective IGBTs of the third embodiment differ from the IGBTs of the first embodiment in that a trench 16c having a constant width from the wafer surface to the trench bottom is provided in place of the upper stage trench 16*a* and lower stage trench 16*b*, and the trench-filling insulating film 17 is buried therein. All other configurations are identical to those of the IGBT according to the first embodiment, and therefore description thereof has been omitted.

Figure 16:
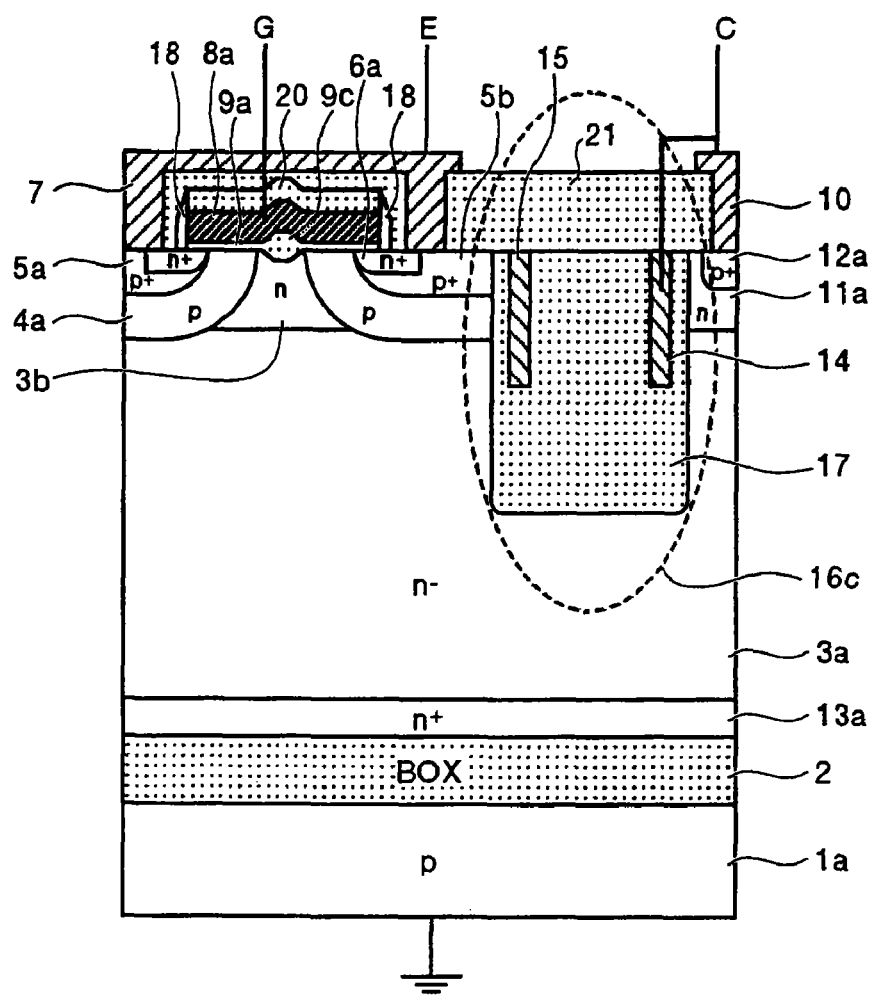
FIG. 16 is a sectional view showing the configuration of an IGBT according to a fourth embodiment.
Figure 17:
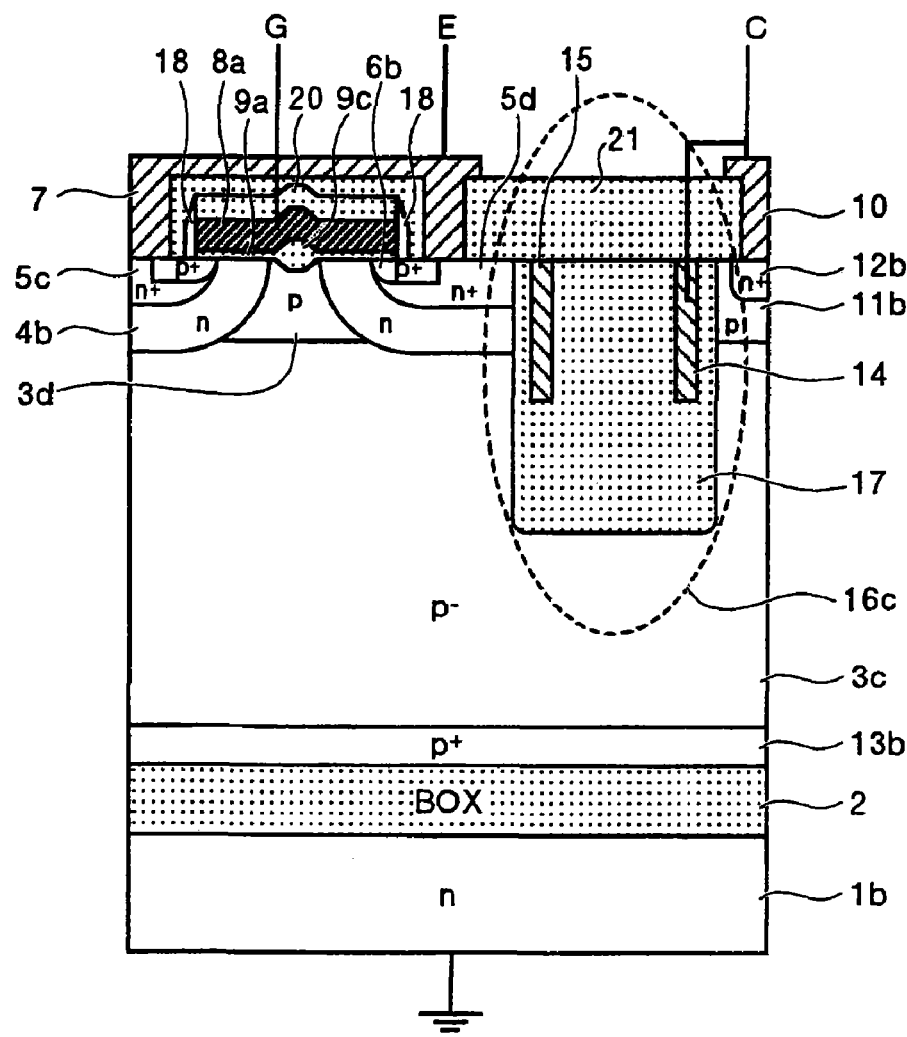
FIG. 17 is a sectional view showing the configuration of an IGBT in which the polarities of the configuration shown in FIG. 16 are reversed.

FIGS. 16 and 17 are sectional views respectively showing an n channel IGBT and a p channel IGBT according to a fourth embodiment. Referring to FIGS. 16 and 17, the respective IGBTs of the fourth embodiment each combine IGBTs having polarities corresponding to the second and third embodiments. More specifically, each drift region 3*a*, 3*c* is provided with a plurality of channels (two in the illustrated example), a trench 16*c* having a constant width from the wafer surface to the trench bottom is provided, and the trench-filling insulating film 17 is buried therein. All other configurations are identical to those of the IGBT according to the second embodiment and the IGBT according to the third embodiment, and therefore description thereof has been omitted.

Figure 18:
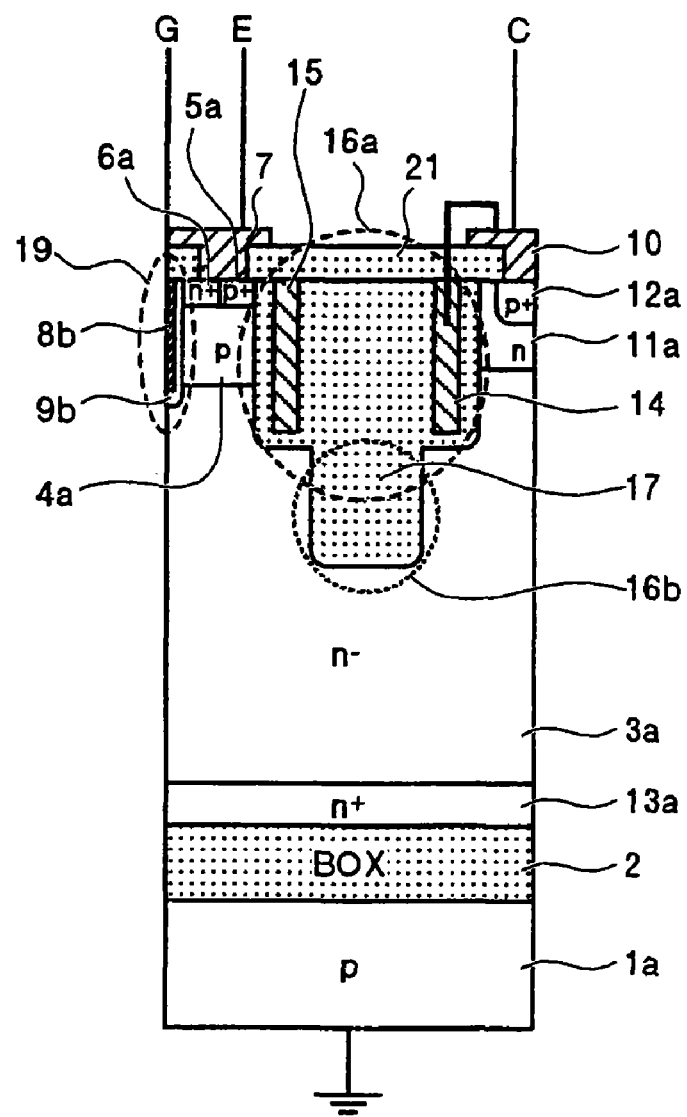
FIG. 18 is a sectional view showing the configuration of an IGBT according to a fifth embodiment.
Figure 19:
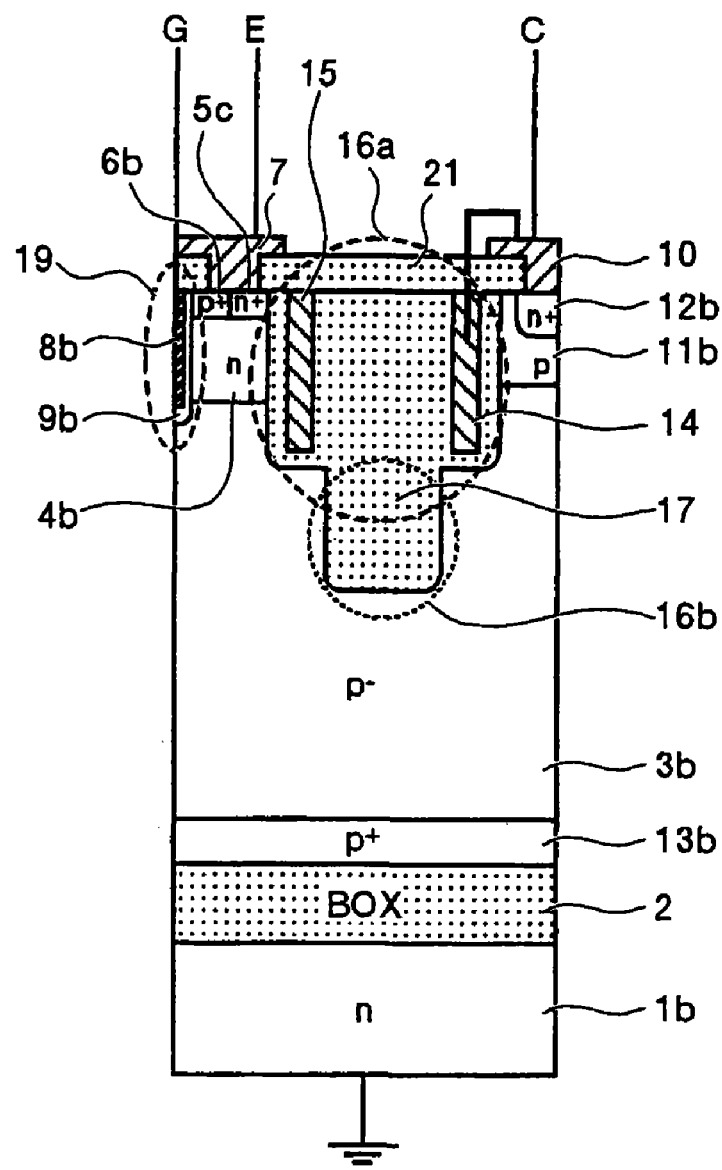
FIG. 19 is a sectional view showing the configuration of an IGBT in which the polarities of the configuration shown in FIG. 18 are reversed.

FIGS. 18 and 19 are sectional views respectively showing an n channel IGBT and a p channel IGBT according to a fifth embodiment. Referring to FIGS. 18 and 19, the IGBTs of the fifth embodiment have a trench gate structure instead of the planar gate structure of the IGBTs according to the first embodiment, and therefore latchup is less likely to occur. More specifically, in the case of the n channel IGBT shown in FIG. 18, a gate trench 19 penetrating the p base region 4*a* from the wafer surface to the n− drift region 3*a* is formed at a remove from the trench-filling insulating film 17 and in contact with the p base region 4*a*. A gate electrode 8*b* is buried inside the gate trench 19 via a gate insulating film 9*b*. The n+ emitter region 6*a* is provided on a part of the p base region 4*a* in contact with the gate trench 19. Further, the p+ low resistance region 5*a* is provided on a part of the p base region 4*a* adjacent to the n+ emitter region 6*a*. The emitter electrode 7 is provided in contact with both the n+ emitter region 6*a* and p+ low resistance region 5*a* so as to short the p+ low resistance region 5*a* and n+ emitter region 6*a*. Note that in the IGBT of the fifth embodiment, the n well region 3*b* contacting the p base region 4*a* is not provided. All other configurations are identical to those of the IGBT according to the first embodiment, and therefore description thereof has been omitted. In the case of the p channel IGBT shown in FIG. 19, the polarities are switched in a similar manner to the first embodiment.

Figure 20:
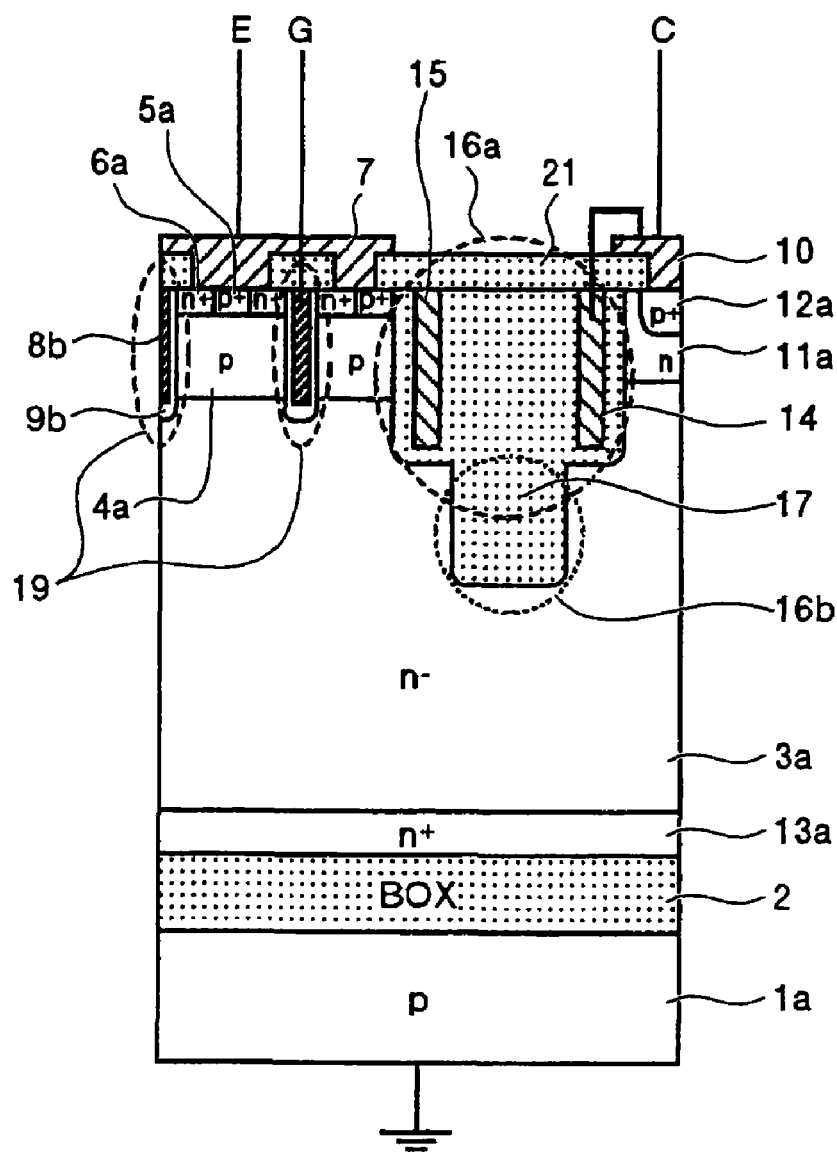
FIG. 20 is a sectional view showing the configuration of an IGBT according to a sixth embodiment.
Figure 21:
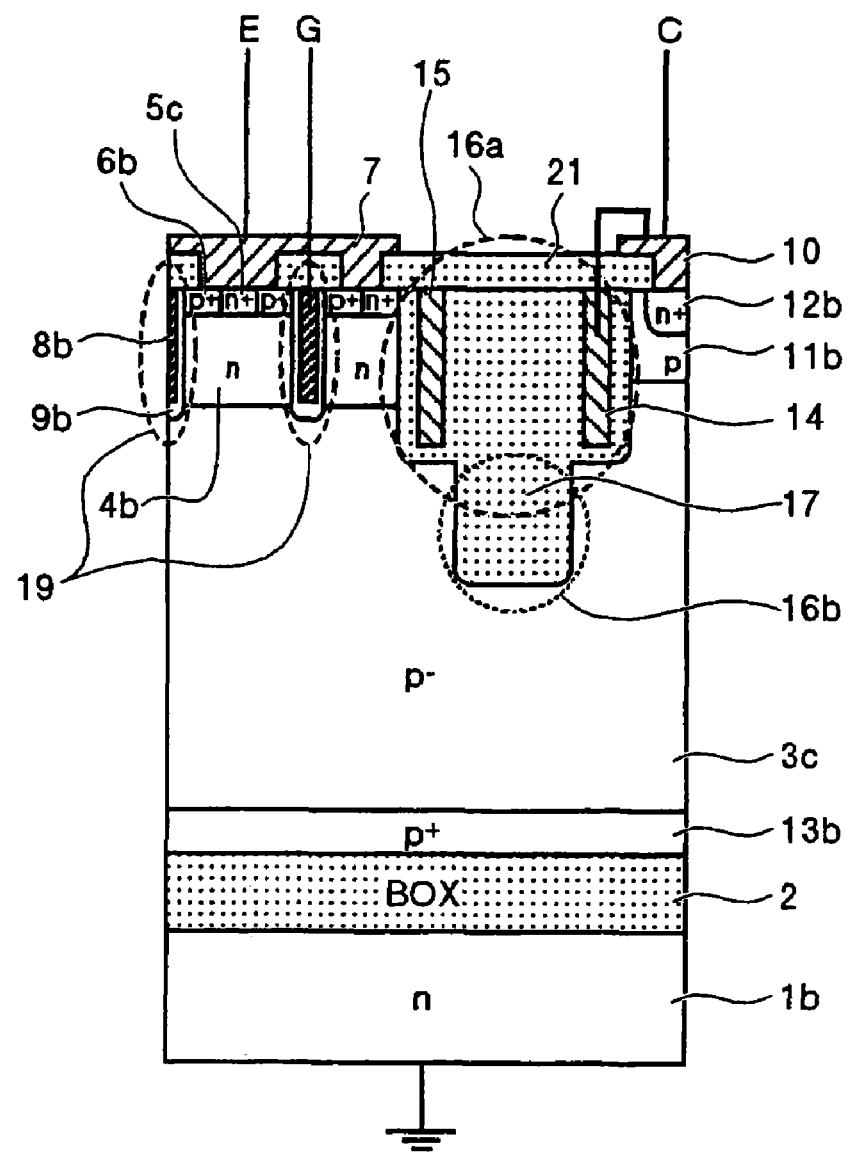
FIG. 21 is a sectional view showing the configuration of an IGBT in which the polarities of the configuration shown in FIG. 20 are reversed.

FIGS. 20 and 21 are sectional views respectively showing an n channel IGBT and a p channel IGBT according to a sixth embodiment. Referring to FIGS. 20 and 21, the IGBT of the sixth embodiment differs from the IGBT of the fifth embodiment in that each drift region 3*a*, 3*c* is provided with a plurality of channels (three in the illustrated example) to achieve a high current capability. All other configurations are identical to those of the IGBT according to the fifth embodiment, and therefore description thereof has been omitted.

Figure 22:
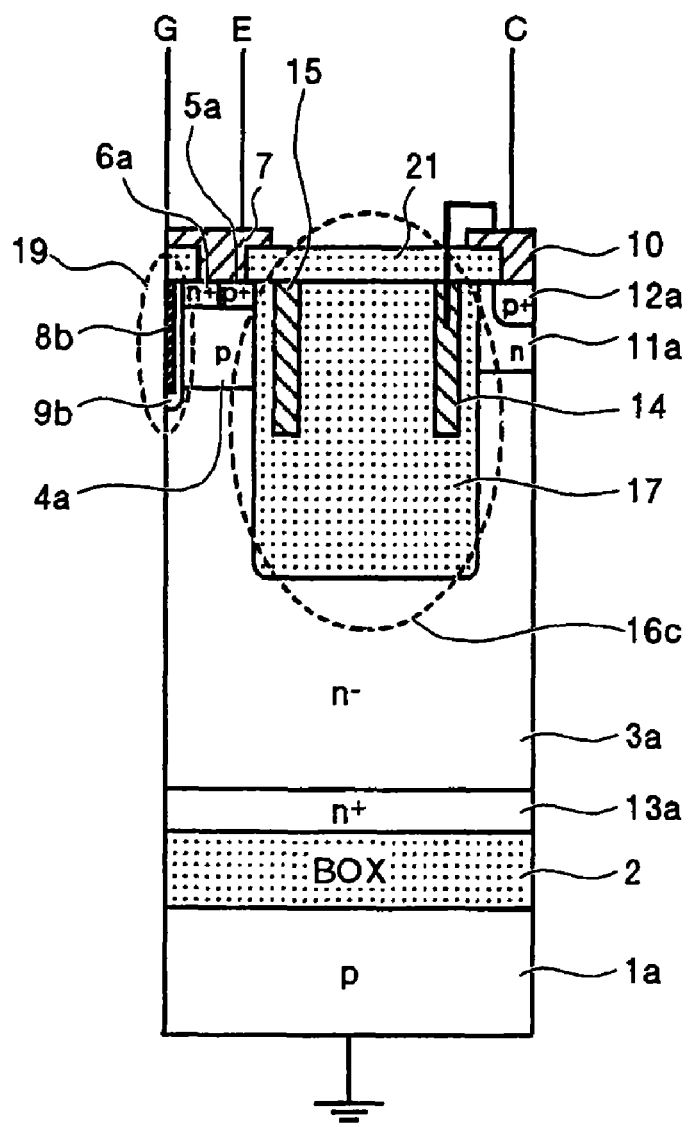
FIG. 22 is a sectional view showing the configuration of an IGBT according to a seventh embodiment.
Figure 23:
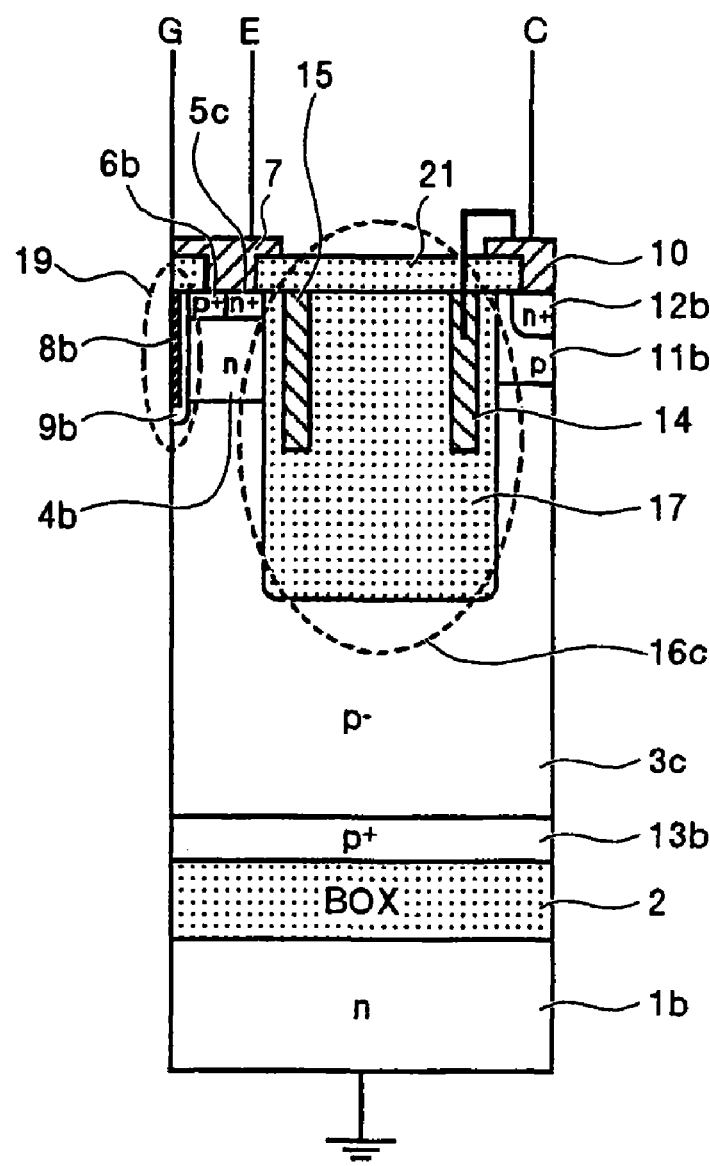
FIG. 23 is a sectional view showing the configuration of an IGBT in which the polarities of the configuration shown in FIG. 22 are reversed.

FIGS. 22 and 23 are sectional views respectively showing an n channel IGBT and a p channel IGBT according to a seventh embodiment. Referring to FIGS. 22 and 23, the IGBTs of the seventh embodiment differ from the IGBTs of the fifth embodiment in that a trench 16*c* having a constant width from the wafer surface to the trench bottom is provided in place of the upper stage trench 16*a* and lower stage trench 16*b*, and the trench-filling insulating film 17 is buried therein. All other configurations are identical to those of the IGBT according to the fifth embodiment, and therefore description thereof has been omitted.

Figure 24:
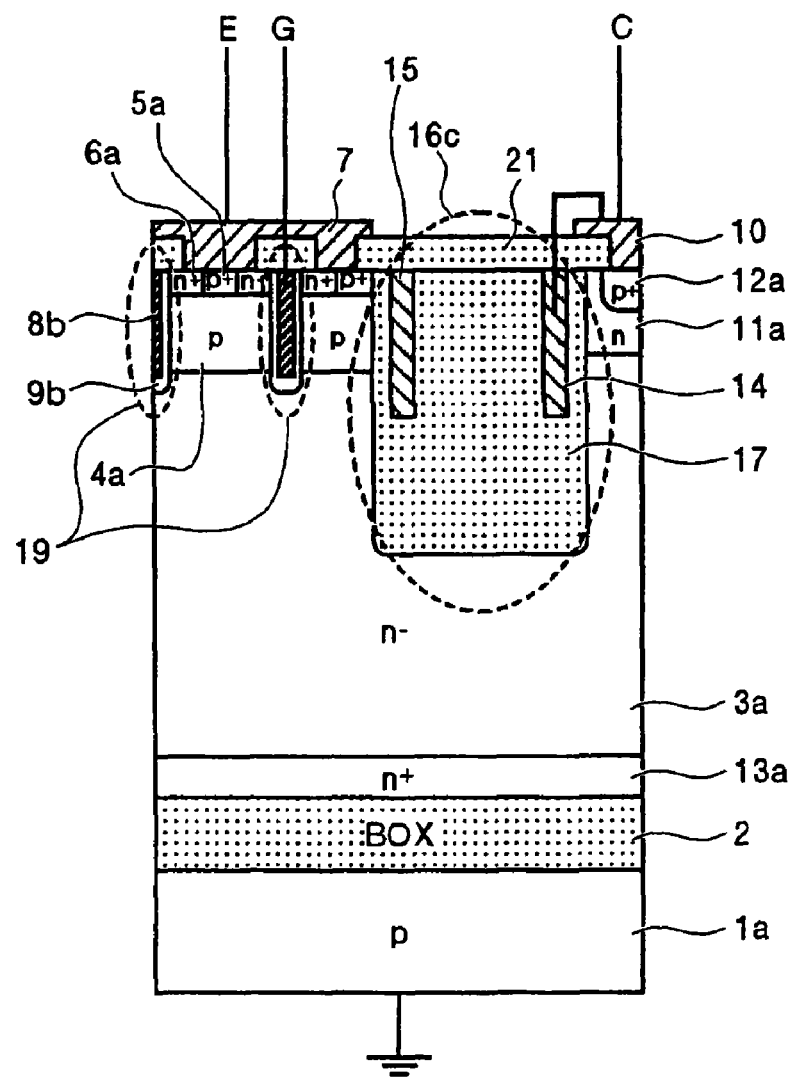
FIG. 24 is a sectional view showing the configuration of an IGBT according to an eighth embodiment.
Figure 25:
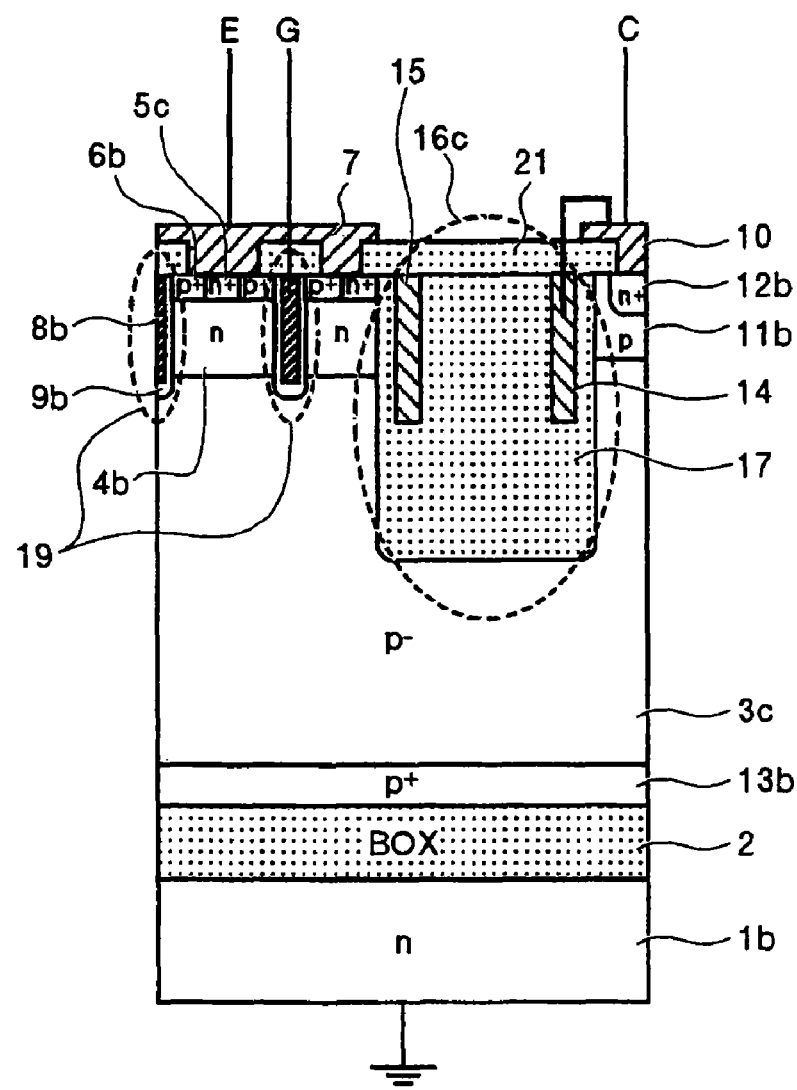
FIG. 25 is a sectional view showing the configuration of an IGBT in which the polarities of the configuration shown in FIG. 24 are reversed.

FIGS. 24 and 25 are sectional views respectively showing an n channel IGBT and a p channel IGBT according to an eighth embodiment. Referring to FIGS. 24 and 25, the respective IGBTs of the eighth embodiment each combine IGBTs having polarities corresponding to the sixth and seventh embodiments. More specifically, each drift region 3*a*, 3*c* is provided with a plurality of channels (three in the illustrated example), a trench 16*c* having a constant width from the wafer surface to the trench bottom is provided, and the trench-filling insulating film 17 is buried therein. All other configurations are identical to those of the IGBT according to the sixth embodiment and the IGBT according to the seventh embodiment, and therefore description thereof has been omitted.

Figure 26:
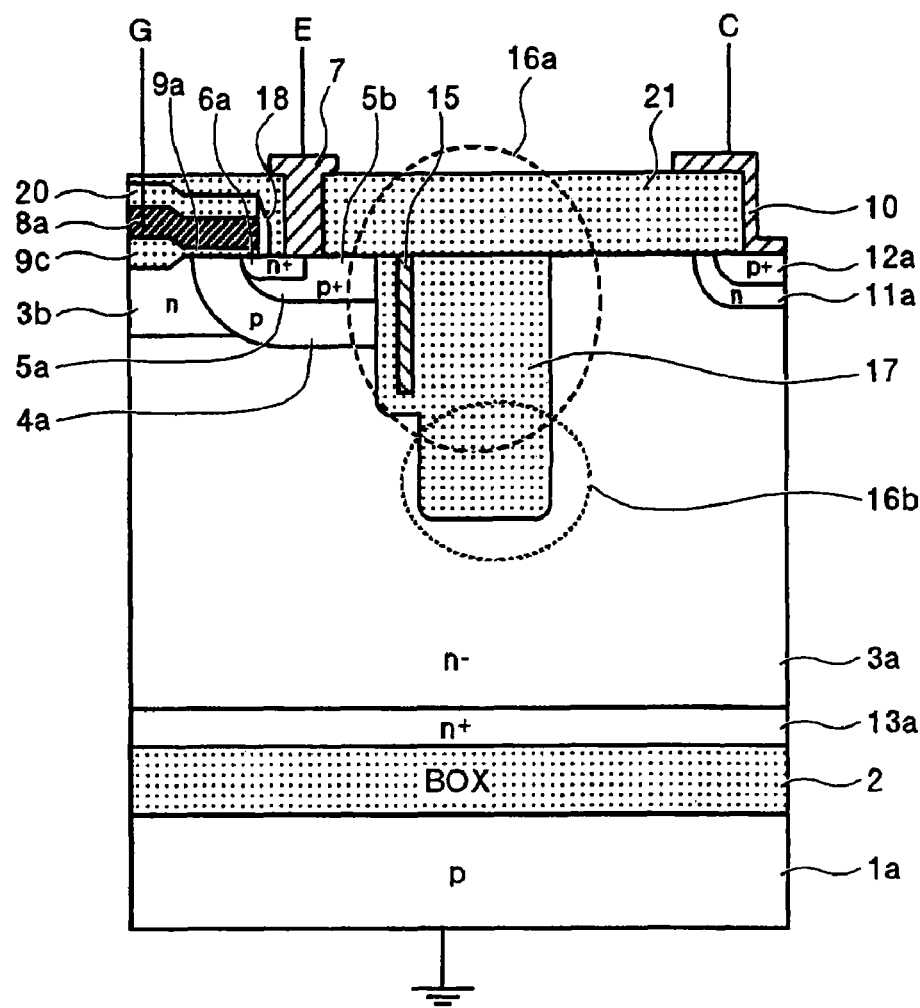
FIG. 26 is a sectional view showing the configuration of an IGBT according to a ninth embodiment.
Figure 27:
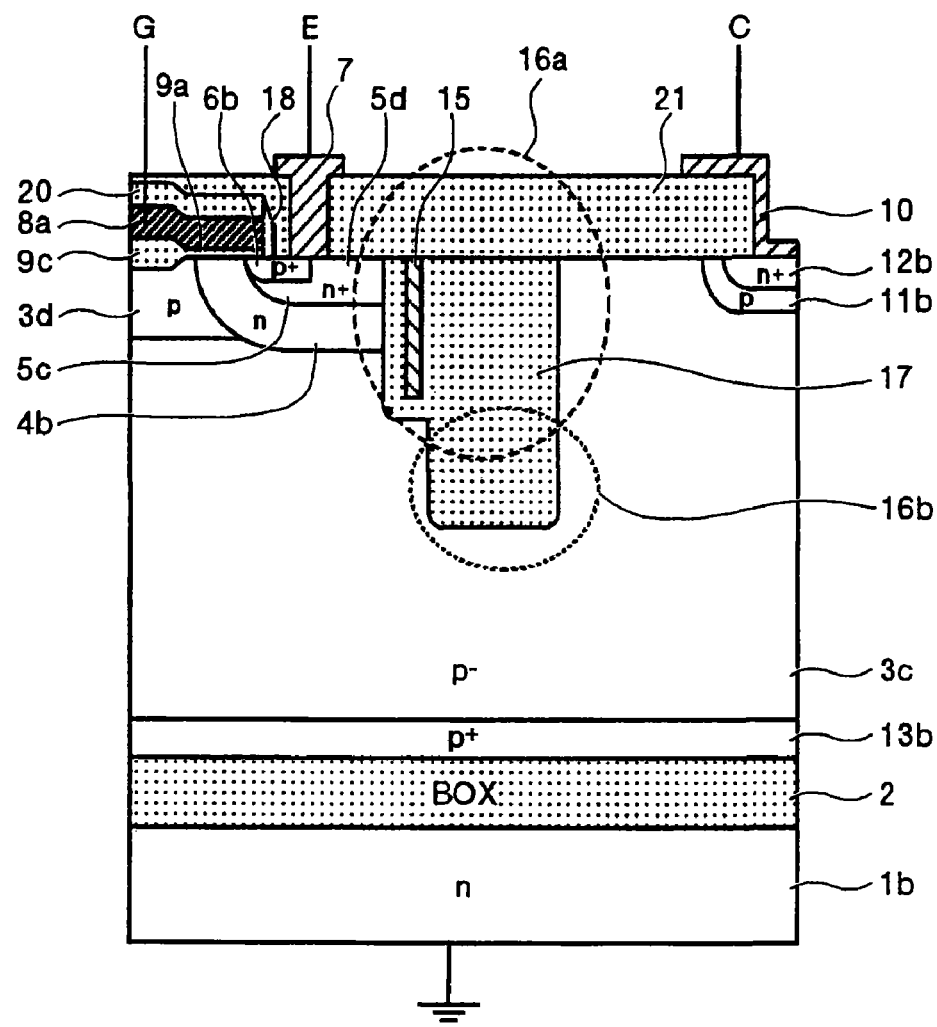
FIG. 27 is a sectional view showing the configuration of an IGBT in which the polarities of the configuration shown in FIG. 26 are reversed.

FIGS. 26 and 27 are sectional views respectively showing an n channel IGBT and a p channel IGBT according to a ninth embodiment. Referring to 26 and 27, the IGBTs of the ninth embodiment differ from the IGBTs of the first embodiment in that the collector-side field plate 14 is not provided. Further, in the n channel IGBT, the upper stage trench 16*a* and the n buffer region 11*a* are separated from each other, and the n− drift region 3*a* is sandwiched between the upper stage trench 16*a* and n buffer region 11*a*. Thus, depletion of the interface between the n buffer region 11*a* and the n− drift region 3*a*, which affects the withstand voltage of the device, is suppressed.

Similarly, in the p channel IGBT, the upper stage trench 16*a* and the p buffer region 11*b* are separated from each other, and the p− drift region 3*c* is sandwiched therebetween. Thus, depletion of the interface between the p buffer region 11*b* and the p− drift region 3*c*, which affects the withstand voltage of the device, is suppressed. Hence, although the device pitch of the respective IGBTs according to the ninth embodiment is slightly longer than the device pitch of the respective IGBTs according to the first embodiment, the device pitch is shorter than the cell pitch of the conventional device shown in FIG. 49.

Further, the current driving capability of the unit cell device of the respective IGBTs according to the ninth embodiment is made approximately identical to the current driving capability of a conventional lateral device by optimizing the device structure and the manufacturing process, and therefore the ON resistance per unit area of the respective IGBTs according to the ninth embodiment is smaller than the ON resistance of a conventional device, and an improvement in short-circuit immunity is achieved. All other configurations are identical to those of the IGBT according to the first embodiment, and therefore description thereof has been omitted.

Figure 28:
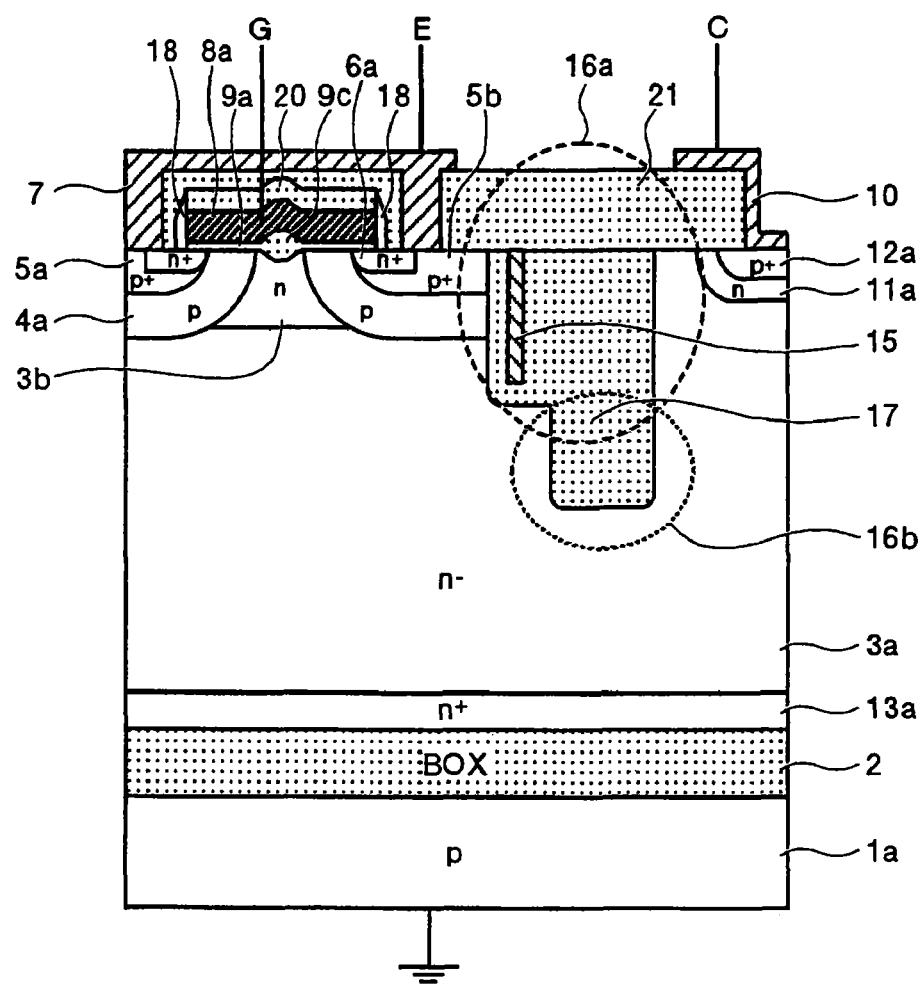
FIG. 28 is a sectional view showing the configuration of an IGBT according to a tenth embodiment.
Figure 29:
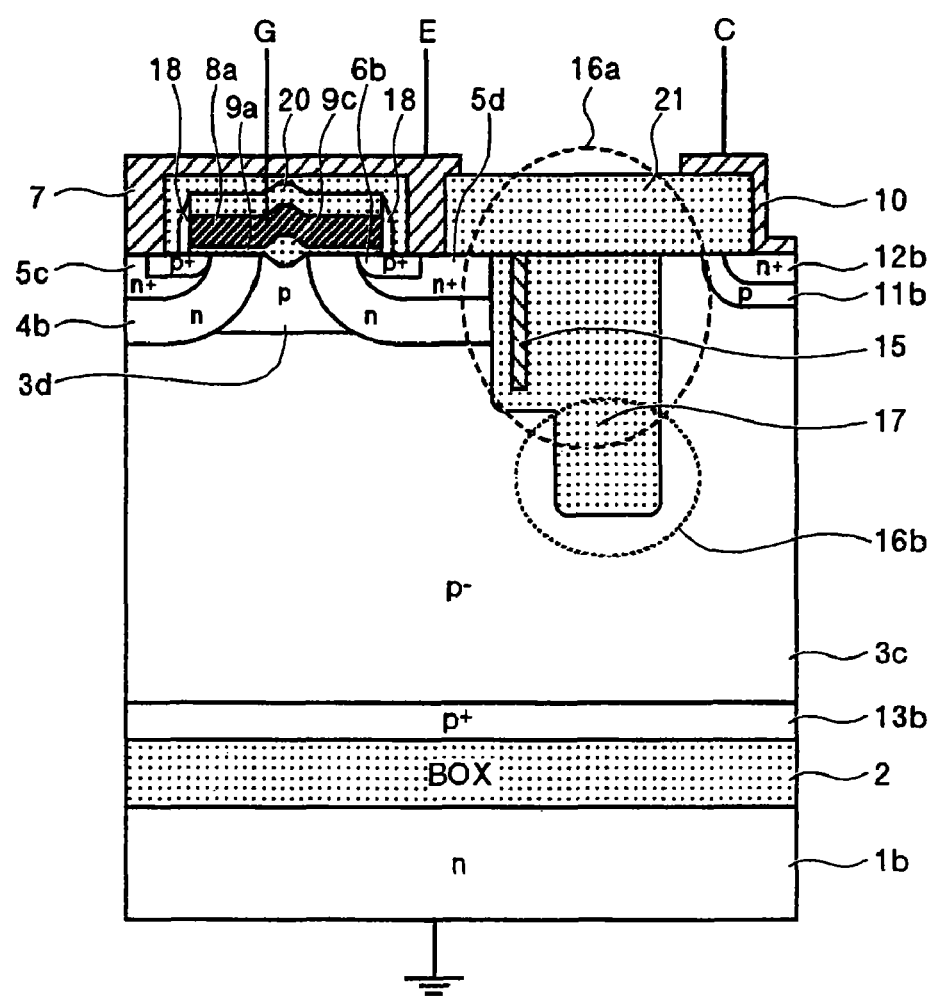
FIG. 29 is a sectional view showing the configuration of an IGBT in which the polarities of the configuration shown in FIG. 28 are reversed.

FIGS. 28 and 29 are sectional views respectively showing an n channel IGBT and a p channel IGBT according to a tenth embodiment. Referring to FIGS. 28 and 29, the IGBT of the tenth embodiment differs from the IGBT of the ninth embodiment in that each drift region 3*a*, 3*c* is provided with a plurality of channels (two in the illustrated example) to achieve a high current capability. All other configurations are identical to those of the IGBT according to the ninth embodiment, and therefore description thereof has been omitted.

Figure 30:
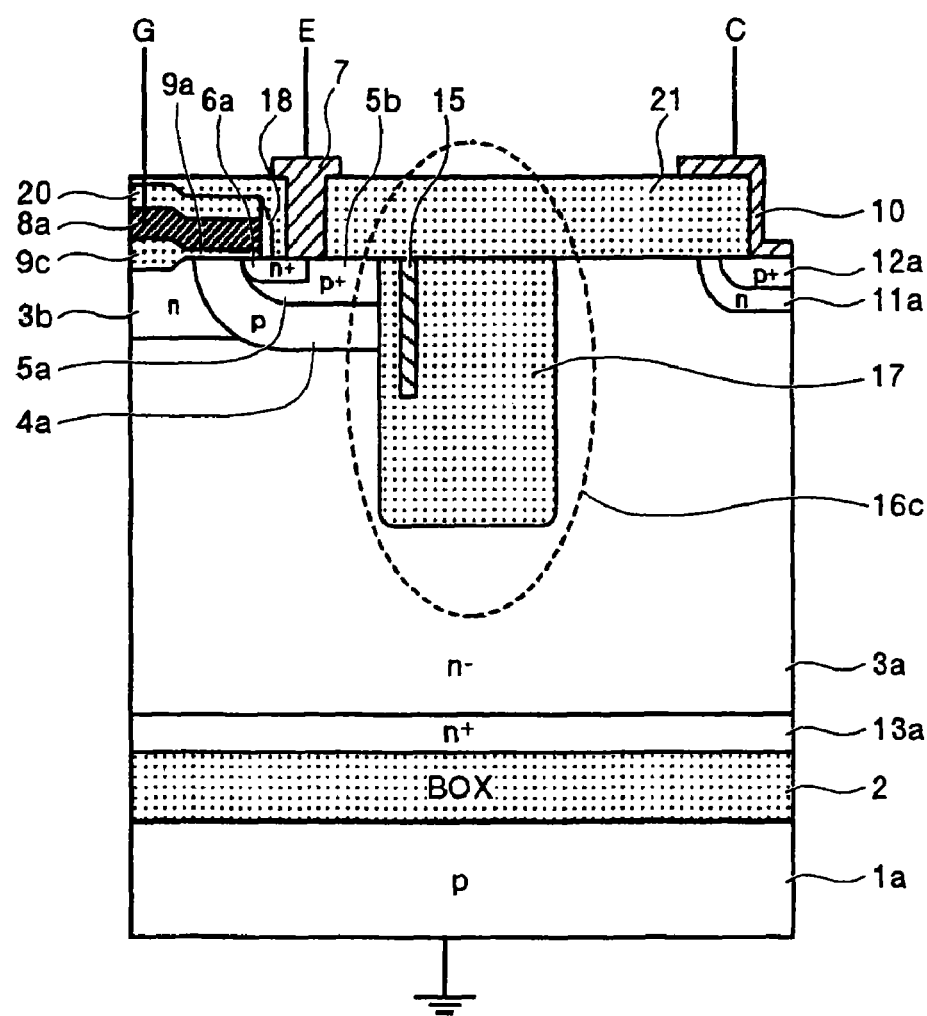
FIG. 30 is a sectional view showing the configuration of an IGBT according to an eleventh embodiment.
Figure 31:
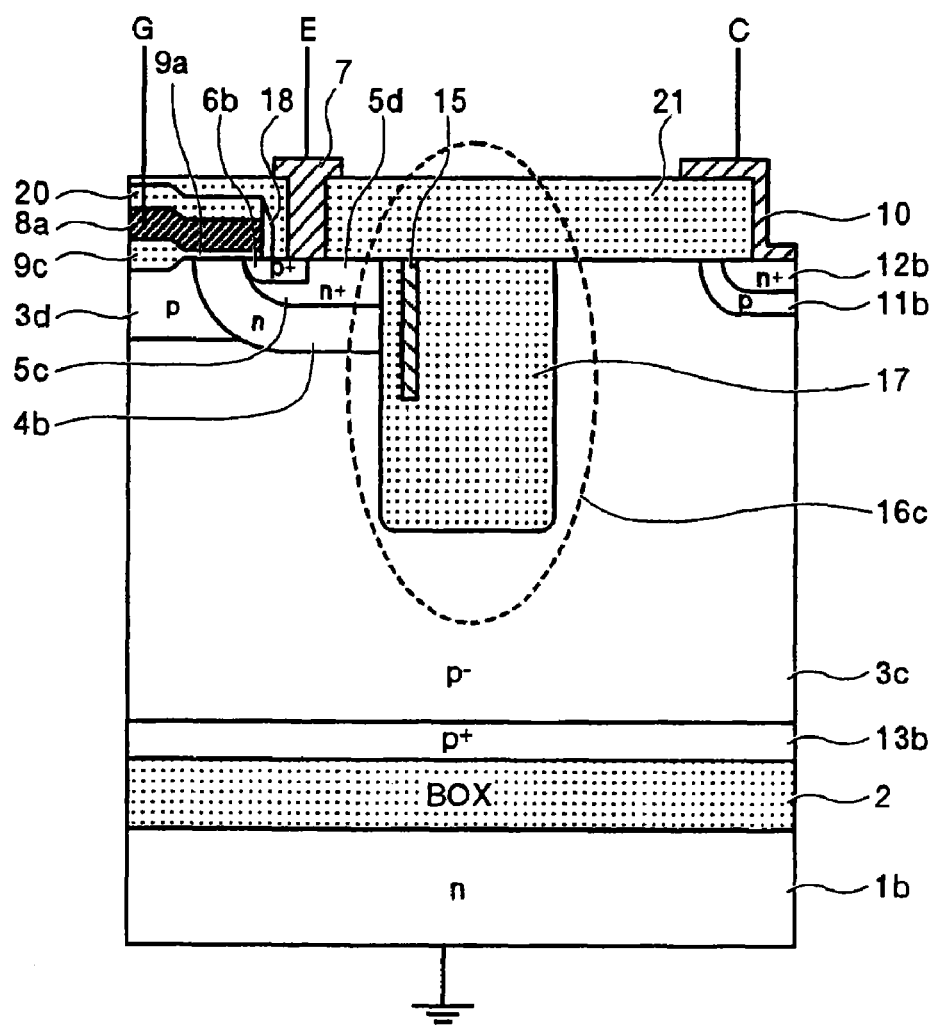
FIG. 31 is a sectional view showing the configuration of an IGBT in which the polarities of the configuration shown in FIG. 30 are reversed.

FIGS. 30 and 31 are sectional views respectively showing an n channel IGBT and a p channel IGBT according to an eleventh embodiment. Referring to FIGS. 30 and 31, the IGBTs of the eleventh embodiment differ from the IGBTs of the ninth embodiment in that a trench 16*c* having a constant width from the wafer surface to the trench bottom is provided in place of the upper stage trench 16*a* and lower stage trench 16*b*, and the trench-filling insulating film 17 is buried therein. All other configurations are identical to those of the IGBT according to the ninth embodiment, and therefore description thereof has been omitted.

Figure 32:
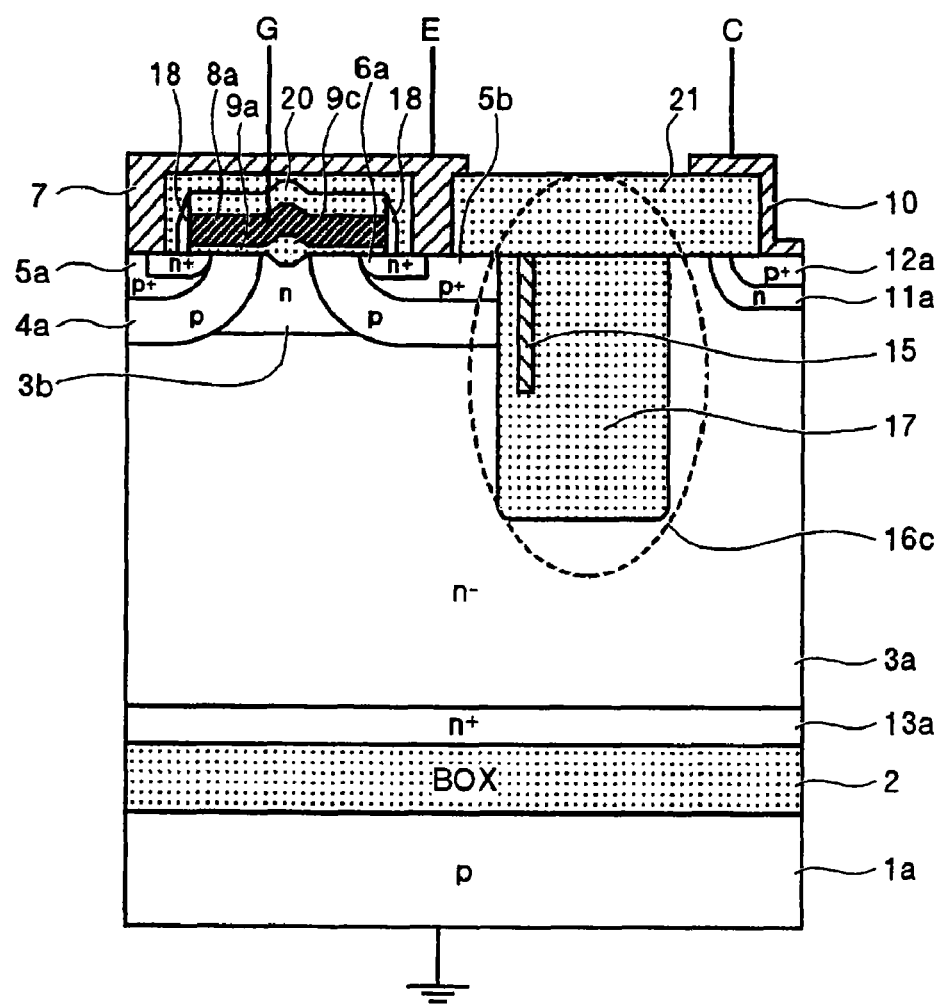
FIG. 32 is a sectional view showing the configuration of an IGBT according to a twelfth embodiment.
Figure 33:
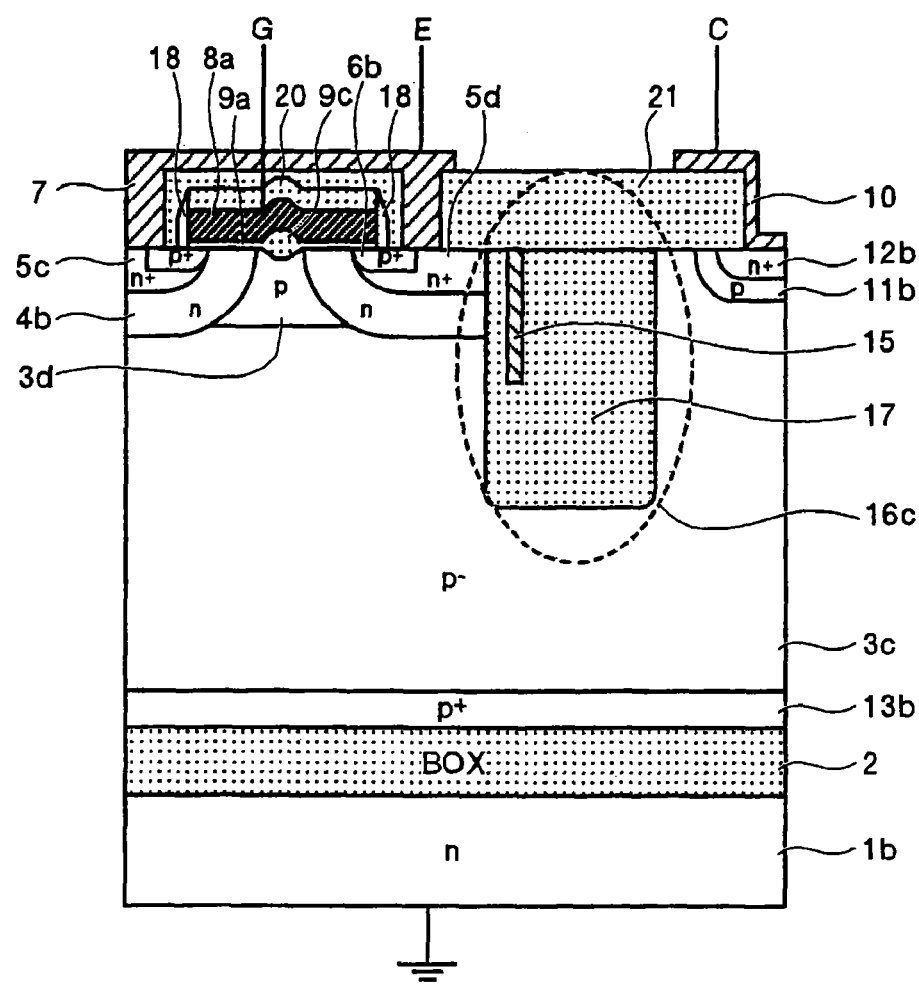
FIG. 33 is a sectional view showing the configuration of an IGBT in which the polarities of the configuration shown in FIG. 32 are reversed.

FIGS. 32 and 33 are sectional views respectively showing an n channel IGBT and a p channel IGBT according to a twelfth embodiment. Referring to FIGS. 32 and 33, the respective IGBTs of the twelfth embodiment each combine IGBTs having polarities corresponding to the tenth and eleventh embodiments. More specifically, each drift region 3a, 3c is provided with a plurality of channels (two in the illustrated example), a trench 16c having a constant width from the wafer surface to the trench bottom is provided, and the trench-filling insulating film 17 is buried therein. All other configurations are identical to those of the IGBT according to the tenth embodiment and the IGBT according to the eleventh embodiment, and therefore description thereof has been omitted.

Figure 34:
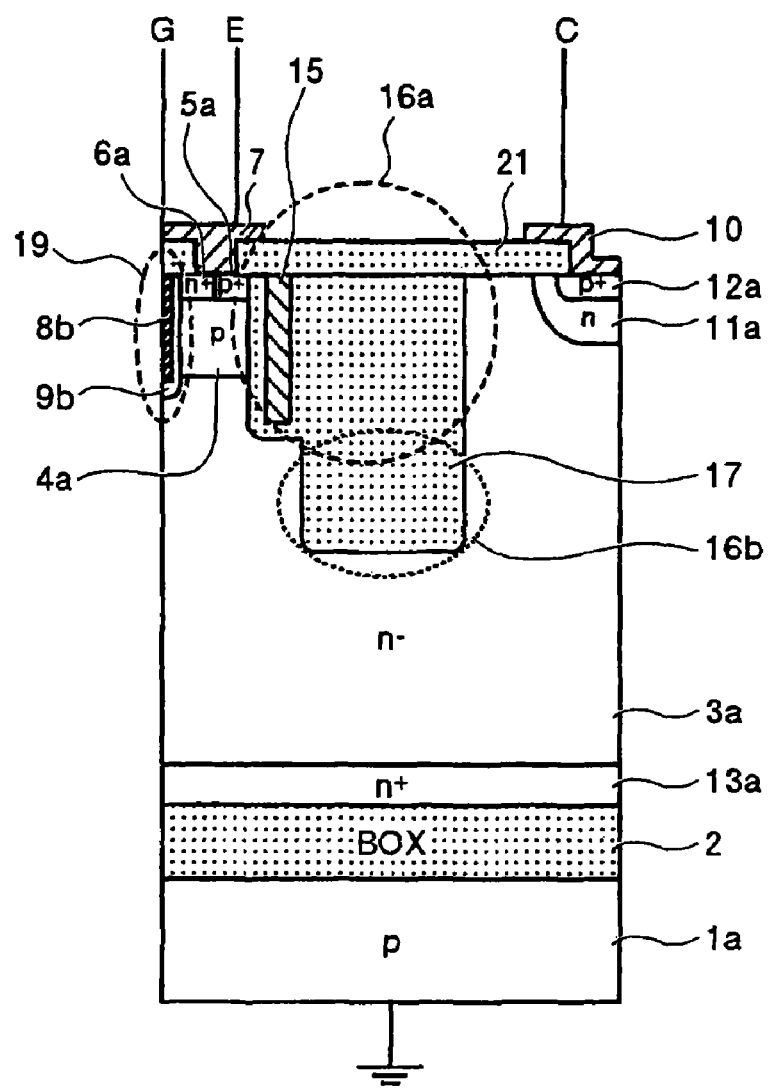
FIG. 34 is a sectional view showing the configuration of an IGBT according to a thirteenth embodiment.
Figure 35:
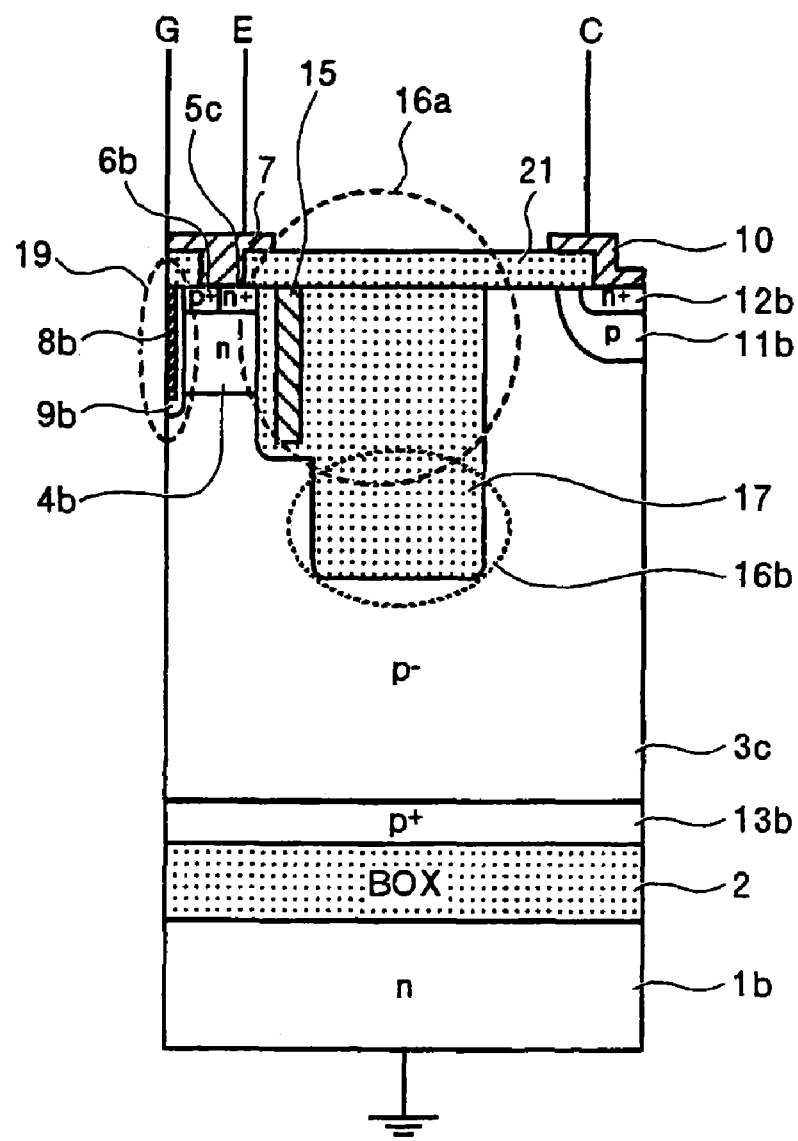
FIG. 35 is a sectional view showing the configuration of an IGBT in which the polarities of the configuration shown in FIG. 34 are reversed.

FIGS. 34 and 35 are sectional views respectively showing an n channel IGBT and a p channel IGBT according to a thirteenth embodiment. Referring to FIGS. 34 and 35, the IGBTs of the thirteenth embodiment differ from the IGBTs of the fifth embodiment in that the collector-side field plate 14 is not provided. Further, in the n channel IGBT, the upper stage trench 16a and the n buffer region 11a are separated from each other, and the n− drift region 3a is sandwiched between the upper stage trench 16a and n buffer region 11a. Thus, depletion of the interface between the n buffer region 11a and the n− drift region 3a, which affects the withstand voltage of the device, is suppressed.

Similarly, in the p channel IGBT, the upper stage trench 16a and the p buffer region 11b are separated from each other, and the p− drift region 3c is sandwiched therebetween. Thus, depletion of the interface between the p buffer region 11b and the p− drift region 3c, which affects the withstand voltage of the device, is suppressed. Hence, although the device pitch of the respective IGBTs according to the thirteenth embodiment is slightly longer than the device pitch of the respective IGBTs according to the fifth embodiment, the device pitch is shorter than the cell pitch of the conventional device shown in FIG. 49. Further, the current driving capability of the unit cell device of the respective IGBTs according to the thirteenth embodiment is made approximately identical to the current driving capability of a conventional lateral device by optimizing the device structure and the manufacturing process, and therefore the ON resistance per unit area of the respective IGBTs according to the thirteenth embodiment is smaller than the ON resistance of a conventional device. All other configurations are identical to those of the IGBT according to the fifth embodiment, and therefore description thereof has been omitted.

Figure 36:
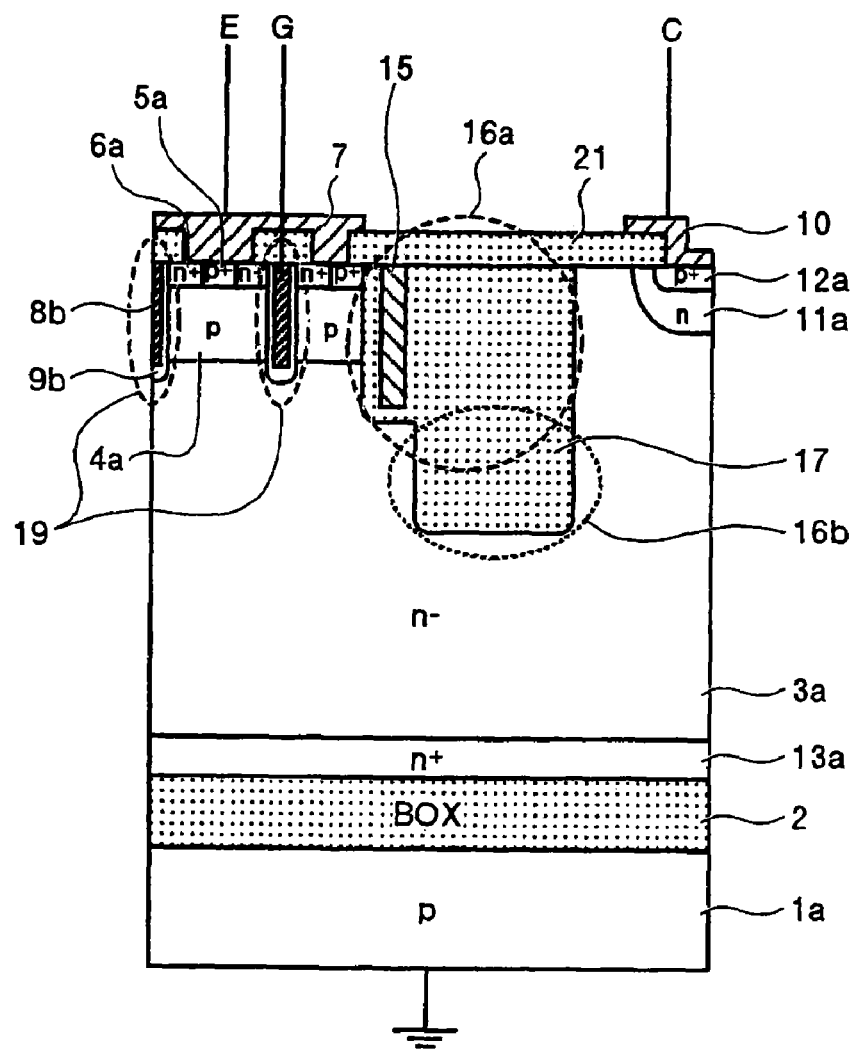
FIG. 36 is a sectional view showing the configuration of an IGBT according to a fourteenth embodiment.
Figure 37:
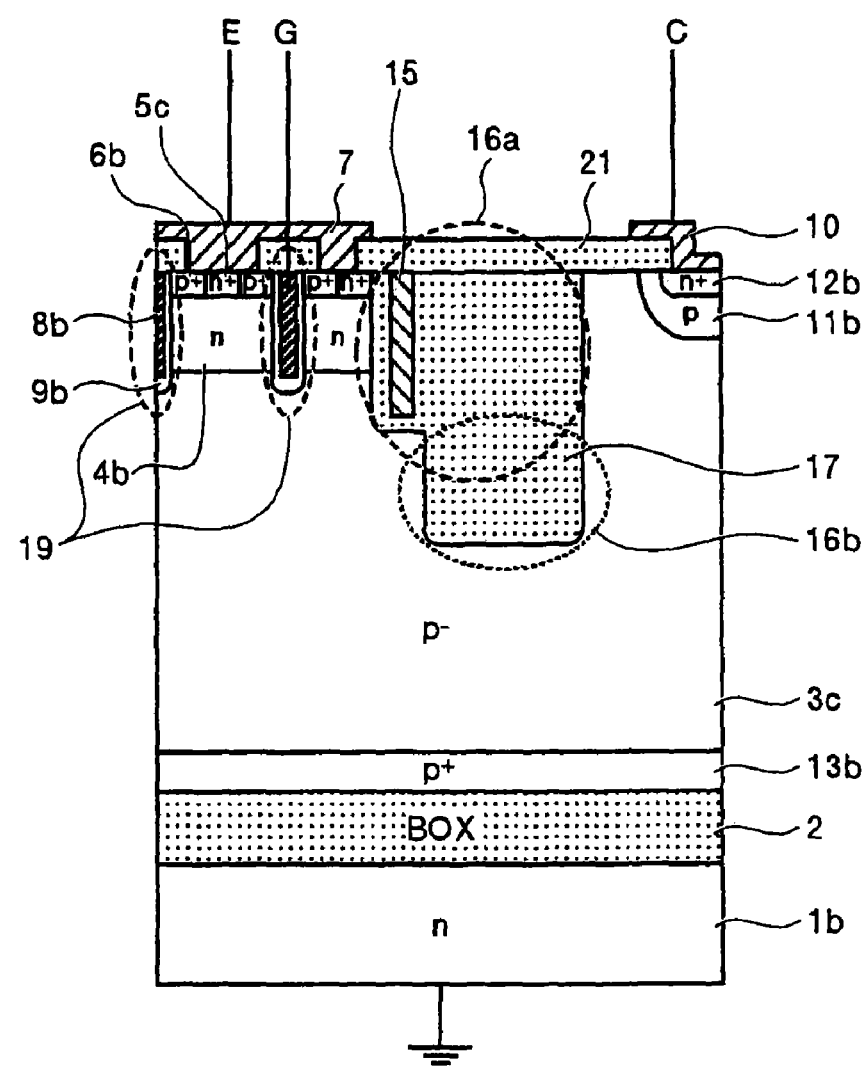
FIG. 37 is a sectional view showing the configuration of an IGBT in which the polarities of the configuration shown in FIG. 36 are reversed.

FIGS. 36 and 37 are sectional views respectively showing an n channel IGBT and a p channel IGBT according to a fourteenth embodiment. Referring to FIGS. 36 and 37, the IGBT of the fourteenth embodiment differs from the IGBT of the thirteenth embodiment in that each drift region 3a, 3c is provided with a plurality of channels (three in the illustrated example) to achieve a high current capability. All other configurations are identical to those of the IGBT according to the thirteenth embodiment, and therefore description thereof has been omitted.

Figure 38:
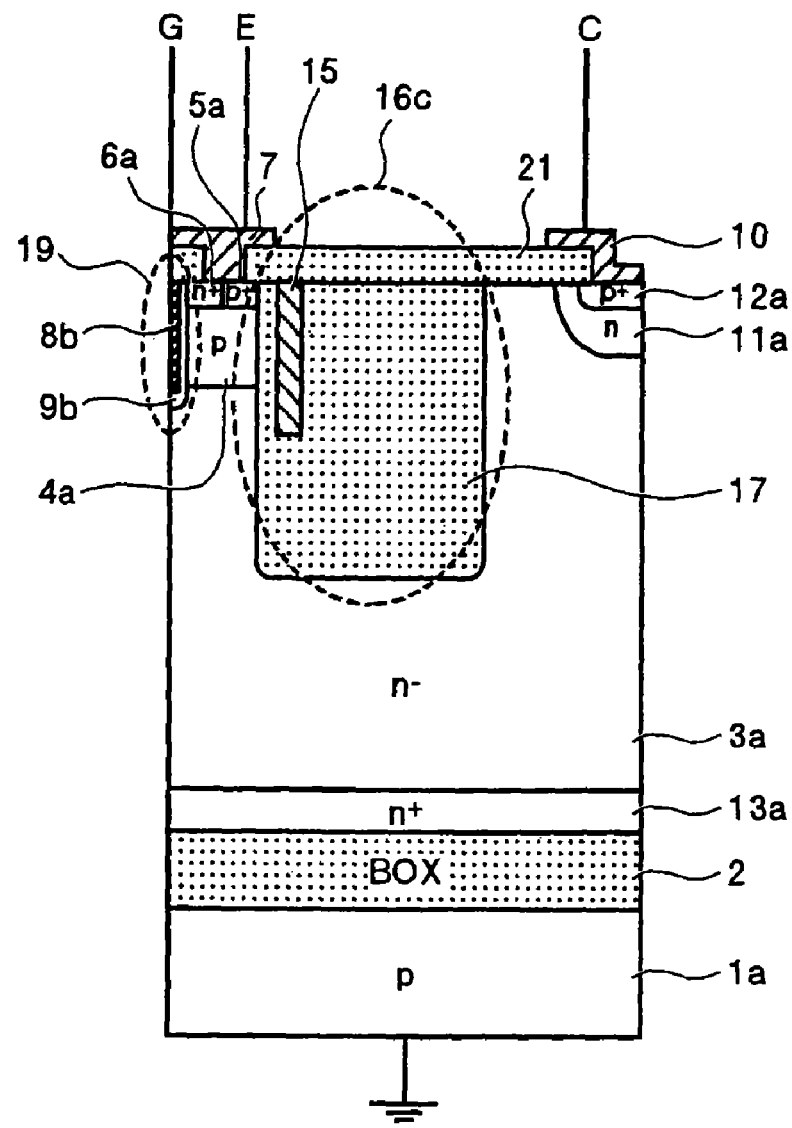
FIG. 38 is a sectional view showing the configuration of an IGBT according to a fifteenth embodiment.
Figure 39:
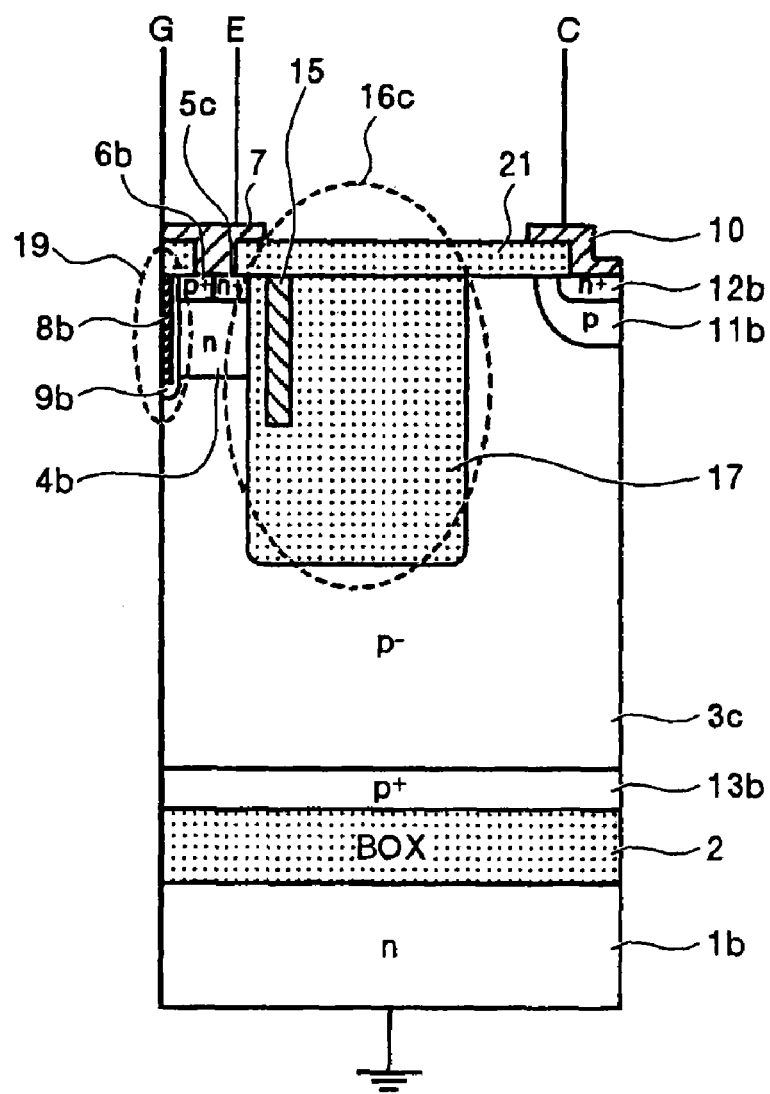
FIG. 39 is a sectional view showing the configuration of an IGBT in which the polarities of the configuration shown in FIG. 38 are reversed.

FIGS. 38 and 39 are sectional views respectively showing an n channel IGBT and a p channel IGBT according to a fifteenth embodiment. Referring to FIGS. 38 and 39, the IGBTs of the fifteenth embodiment differ from the IGBTs of the thirteenth embodiment in that a trench 16c having a constant width from the wafer surface to the trench bottom is provided in place of the upper stage trench 16a and lower stage trench 16b, and the trench-filling insulating film 17 is buried therein. All other configurations are identical to those of the IGBT according to the thirteenth embodiment, and therefore description thereof has been omitted.

Figure 40:
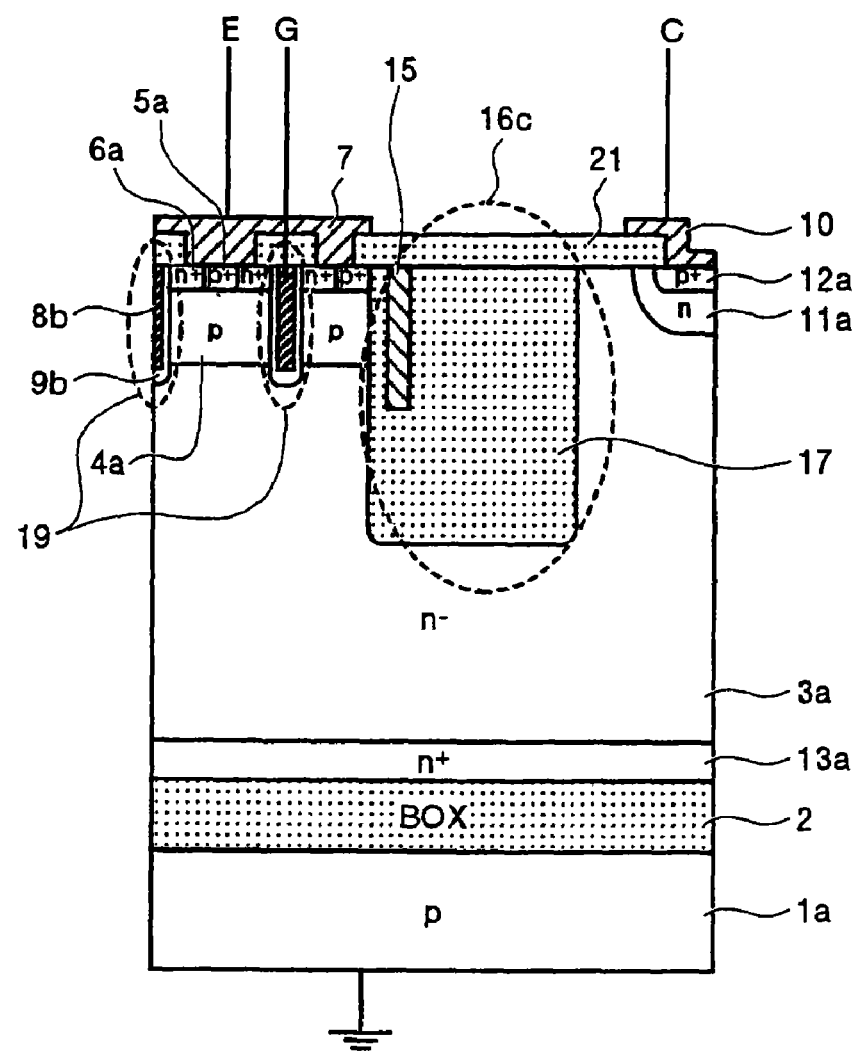
FIG. 40 is a sectional view showing the configuration of an IGBT according to a sixteenth embodiment.
Figure 41:
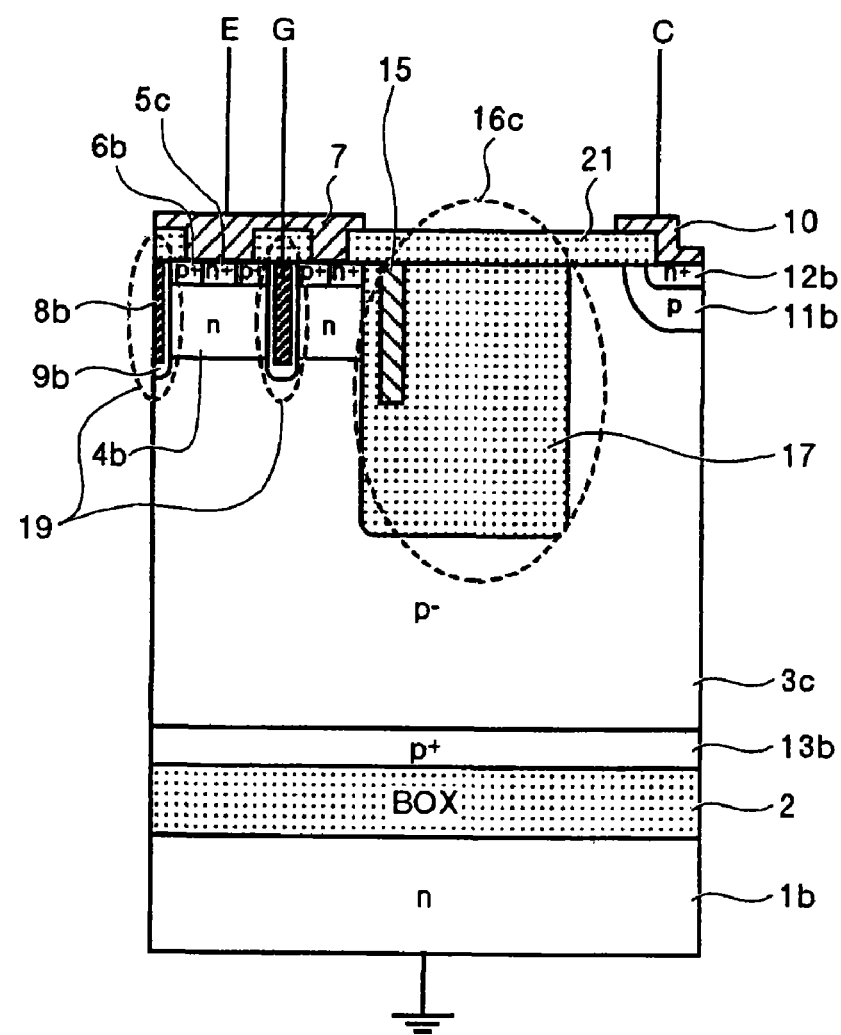
FIG. 41 is a sectional view showing the configuration of an IGBT in which the polarities of the configuration shown in FIG. 40 are reversed.

FIGS. 40 and 41 are sectional views respectively showing an n channel IGBT and a p channel IGBT according to a sixteenth embodiment. Referring to FIGS. 40 and 41, the respective IGBTs of the sixteenth embodiment each combine IGBTs having polarities corresponding to the fourteenth and fifteenth embodiments. More specifically, each drift region 3a, 3c is provided with a plurality of channels (three in the illustrated example), a trench 16c having a constant width from the wafer surface to the trench bottom is provided, and the trench-filling insulating film 17 is buried therein. All other configurations are identical to those of the IGBT according to the fourteenth embodiment and the IGBT according to the fifteenth embodiment, and therefore description thereof has been omitted.

Figure 42:
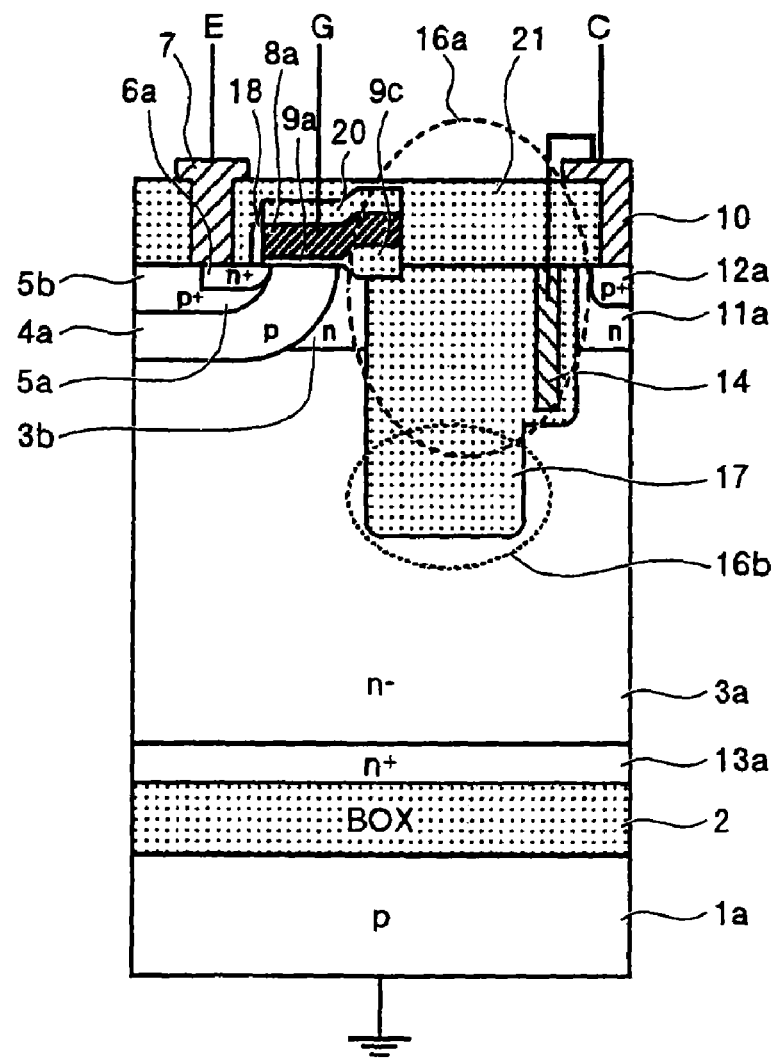
FIG. 42 is a sectional view showing the configuration of an IGBT according to a seventeenth embodiment.
Figure 43:
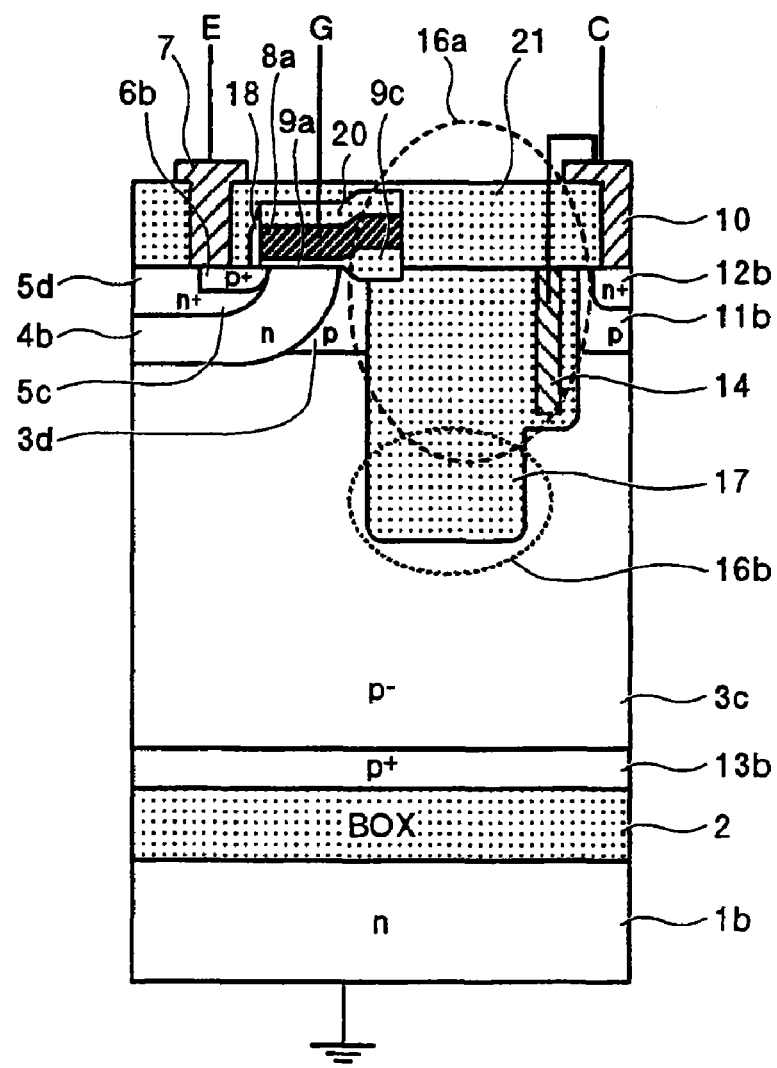
FIG. 43 is a sectional view showing the configuration of an IGBT in which the polarities of the configuration shown in FIG. 42 are reversed.

FIGS. 42 and 43 are sectional views respectively showing an n channel IGBT and a p channel IGBT according to a seventeenth embodiment. Referring to FIGS. 42 and 43, the n channel IGBT of the seventeenth embodiment differs from the n channel IGBT of the first embodiment in that the trench-filling insulating film 17 contacts only the n− drift region 3a, the n well region 3b, and the n buffer region 11a. In other words, the trench-filling insulating film 17 does not contact the p base region 4a and the p+ base contact region 5b. Hence, in the seventeenth embodiment, the emitter-side field plate 15 is not necessary. The carrier implanted from the p+ collector region 12a reaches the emitter electrode 7 through the n well region 3b, the surface channel on the interface between the p base region 4a and gate insulating film 9a, the p+ low resistance region 5a, and the p+ base contact region 5b. Similarly, in the p channel IGBT, the trench-filling insulating film 17 contacts only the p− drift region 3c, the p well region 3d, and the p buffer region 11b, and does not contact the n base region 4b and the n+ base contact region 5d. Accordingly, the emitter-side field plate 15 is not provided. The carrier implanted from the n+ collector region 12b reaches the emitter electrode 7 through the p well region 3d, the surface channel on the interface between the n base region 4b and gate insulating film 9a, the n+ low resistance region 5c, and the n+ base contact region 5d.

Figure 49:
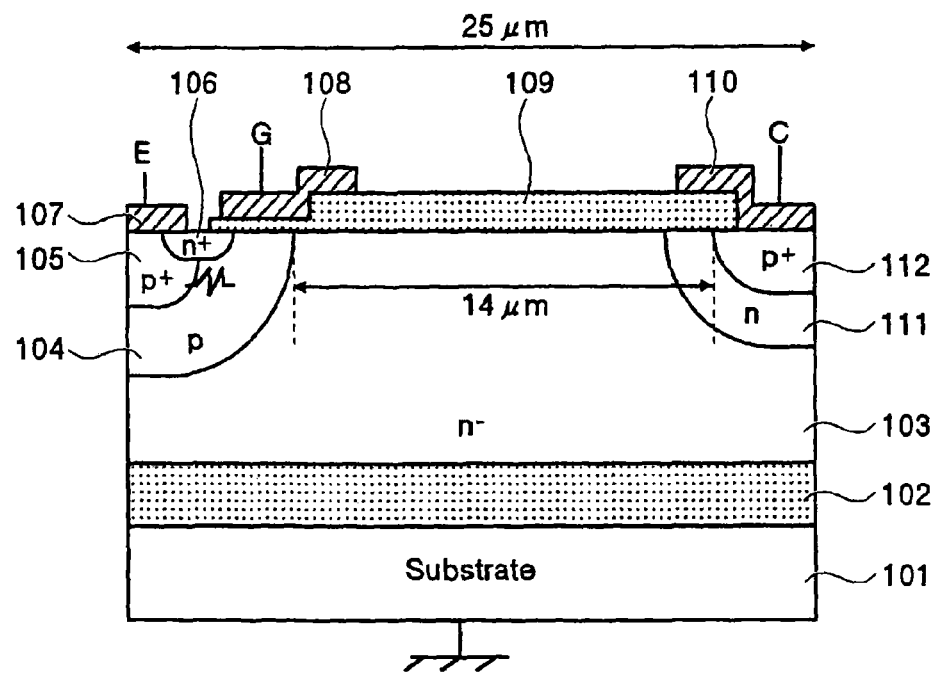
FIG. 49 is a view showing the sectional configuration of an IGBT manufactured using a conventional thick-film SOI substrate.
Figure 50:
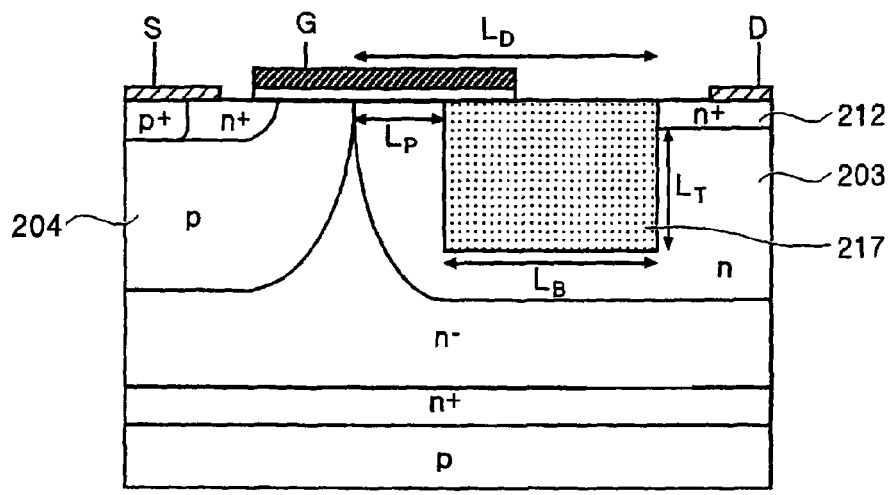
FIG. 50 is a view showing the sectional configuration of a conventional lateral MOS transistor.

The device pitch of the respective IGBTs according to the seventeenth embodiment is shorter than the cell pitch of the conventional device shown in FIG. 49. Further, the current driving capability of the unit cell device of the respective IGBTs according to the seventeenth embodiment is made approximately identical to the current driving capability of a conventional lateral device by optimizing the device structure and the manufacturing process, and therefore the ON resistance per unit area of the respective IGBTs according to the seventeenth embodiment is smaller than the ON resistance of a conventional device. All other configurations are identical to those of the IGBT according to the first embodiment, and therefore description thereof has been omitted.

Figure 44:
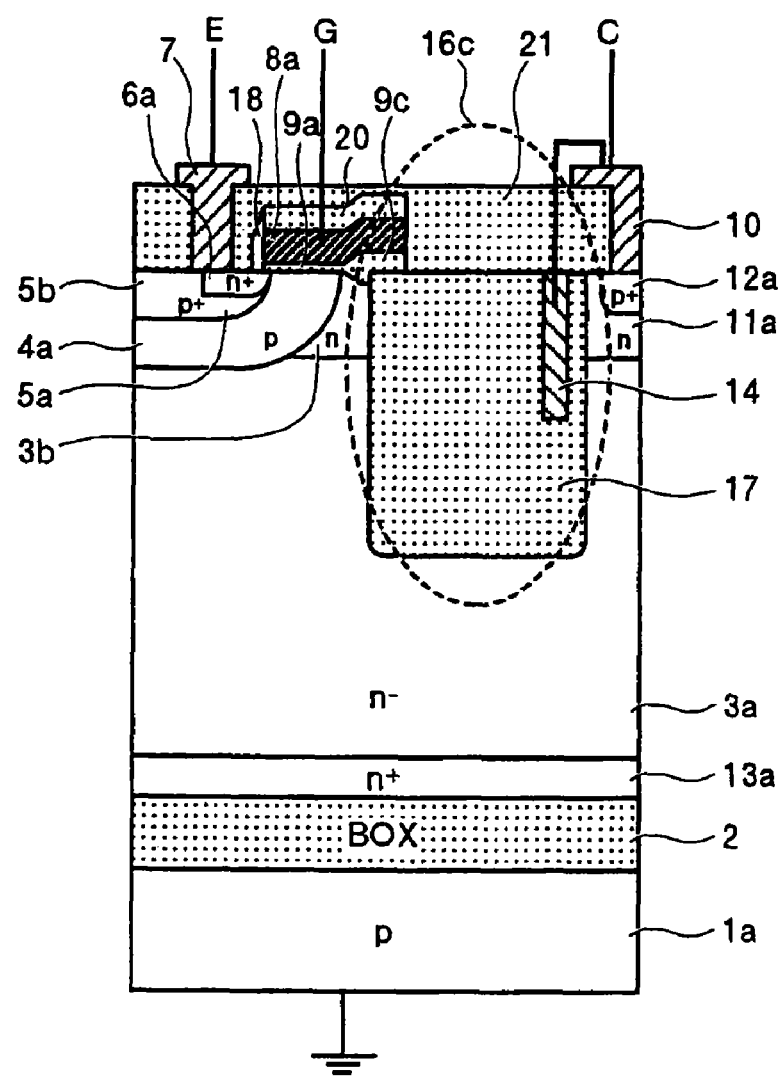
FIG. 44 is a sectional view showing the configuration of an IGBT according to an eighteenth embodiment.
Figure 45:
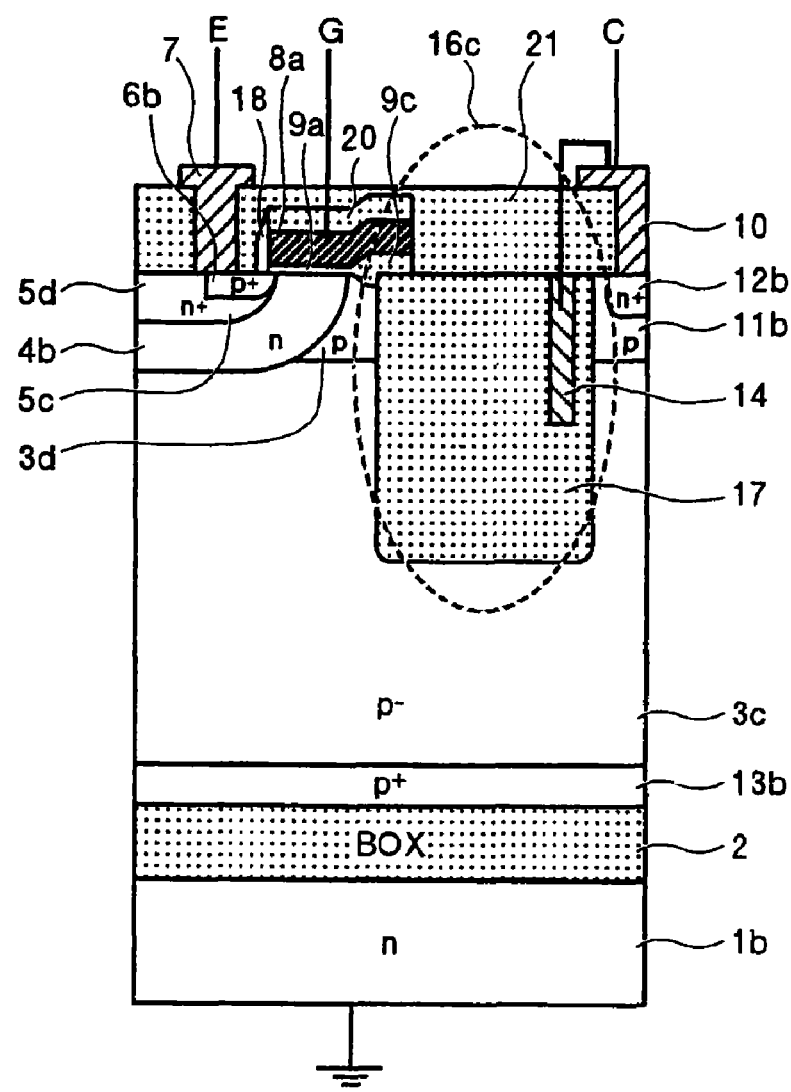
FIG. 45 is a sectional view showing the configuration of an IGBT in which the polarities of the configuration shown in FIG. 44 are reversed.

FIGS. 44 and 45 are sectional views respectively showing an n channel IGBT and a p channel IGBT according to an eighteenth embodiment. Referring to FIGS. 44 and 45, the IGBTs of the eighteenth embodiment differ from the IGBTs of the seventeenth embodiment in that a trench 16c having a constant width from the wafer surface to the trench bottom is provided in place of the upper stage trench 16a and lower stage trench 16b, and the trench-filling insulating film 17 is buried therein. All other configurations are identical to those of the IGBT according to the seventeenth embodiment, and therefore description thereof has been omitted.

Figure 46:
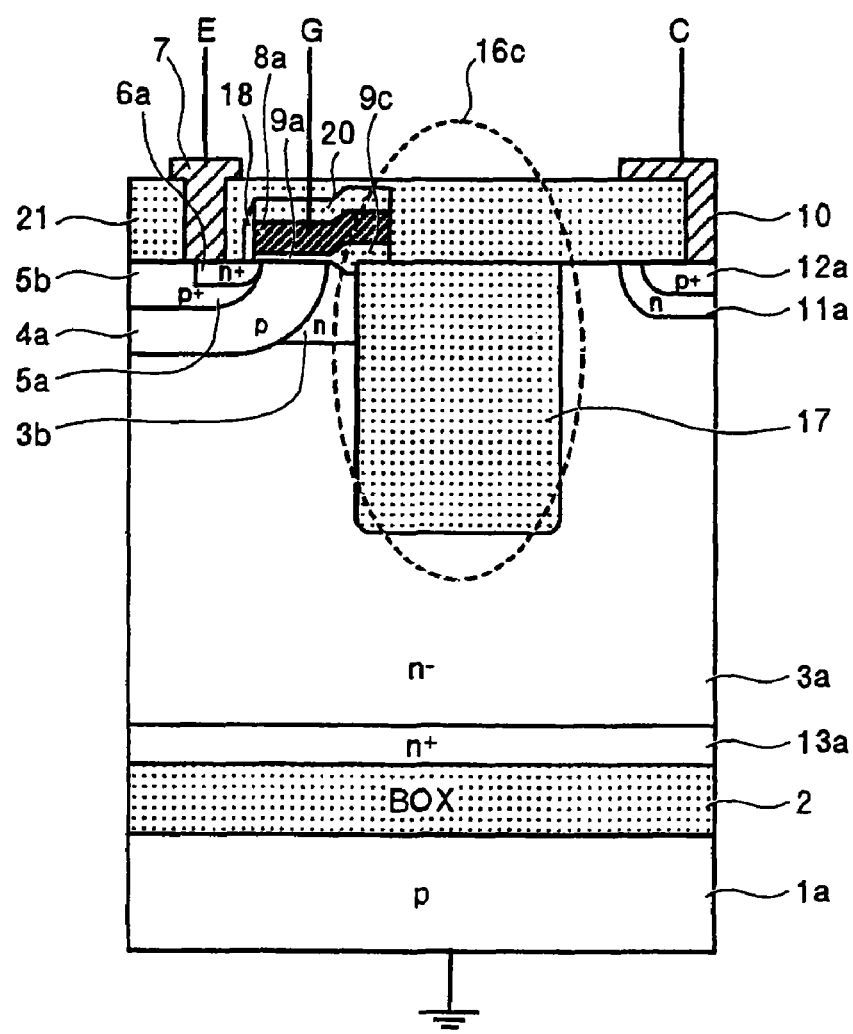
FIG. 46 is a sectional view showing the configuration of an IGBT according to a nineteenth embodiment.
Figure 47:
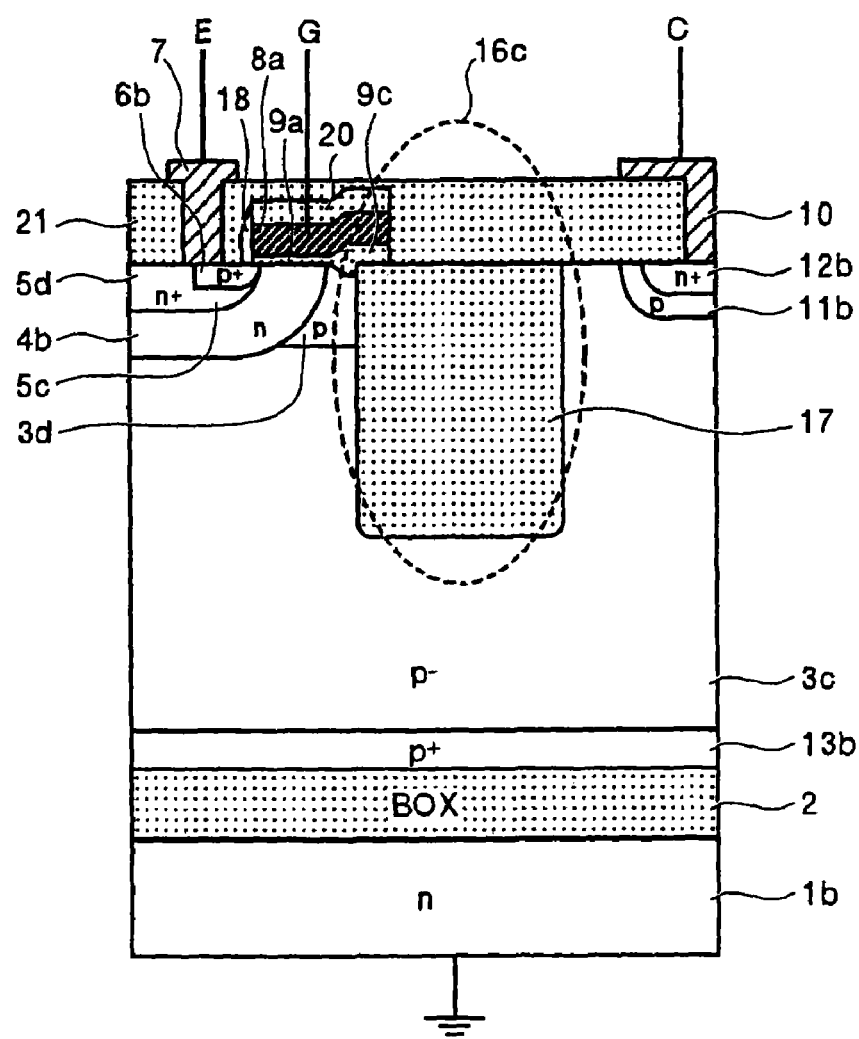
FIG. 47 is a sectional view showing the configuration of an IGBT in which the polarities of the configuration shown in FIG. 46 are reversed.

FIGS. 46 and 47 are sectional views respectively showing an n channel IGBT and a p channel IGBT according to a nineteenth embodiment. Referring to FIGS. 46 and 47, the n channel IGBT of the nineteenth embodiment differs from the n channel IGBT of the first embodiment in that the trench-filling insulating film 17 contacts only the n− drift region 3a and the n well region 3b, and does not contact the p base region 4a and the p+ base contact region 5b. Hence, the emitter-side field plate 15 is not necessary. Further, the collector-side field plate 14 is not provided, the trench 16c and the n buffer region 11a are separated from each other, and the n− drift region 3a is sandwiched therebetween. Thus, depletion of the interface between the n buffer region 11a and the n− drift region 3a, which affects the withstand voltage of the device, is suppressed. The carrier implanted from the p+ collector region 12a reaches the emitter electrode 7 through the n well region 3b, the surface channel on the interface between the p base region 4a and gate insulating film 9a, the p+ low resistance region 5a, and the p+ base contact region 5b. Similarly, in the p channel IGBT, the trench-filling insulating film 17 contacts only the p− drift region 3c and the p well region 3d, and does not contact the n base region 4b and the n+ base contact region 5d. Accordingly, the emitter-side field plate 15 is not provided. Further, the collector-side field plate 14 is not provided, the trench 16c and the p buffer region 11b are separated from each other, and the p− drift region 3c is sandwiched therebetween. Thus, depletion of the interface between the p buffer region 11b and the p− drift region 3c, which affects the withstand voltage of the device, is suppressed. The carrier implanted from the n+ collector region 12b reaches the emitter electrode 7 through the p well region 3d, the surface channel on the interface between the n base region 4b and gate insulating film 9a, the n+ low resistance region 5c, and the n+ base contact region 5d.

The device pitch of the respective IGBTs according to the nineteenth embodiment is slightly longer than device pitch of the respective IGBTs according to the seventeenth and eighteenth embodiments, but shorter than the cell pitch of the conventional device shown in FIG. 49. Further, the current driving capability of the unit cell device of the respective IGBTs according to the nineteenth embodiment is made approximately identical to the current driving capability of a conventional lateral device by optimizing the device structure and the manufacturing process, and therefore the ON resistance per unit area of the respective IGBTs according to the nineteenth embodiment is smaller than the ON resistance of a conventional device. All other configurations are identical to those of the IGBT according to the first embodiment, and therefore description thereof has been omitted.

The differences between the device according to the nineteenth embodiment and the device disclosed in the aforementioned second reference will now be described. In the device of the nineteenth embodiment, the n+ minority carrier canceling layer 13a (p+ minority carrier canceling layer 13b) contacts the insulating layer 2 over its entire surface, and therefore adhesion precision is not required when the SOI wafer is manufactured according to the adhesion method described in the first embodiment. Hence, manufacture can be performed easily. In contrast, the device disclosed in the second reference requires adhesion precision in the order of μm, and is therefore unfavorable in terms of manufacture, as noted above.

Figure 48:
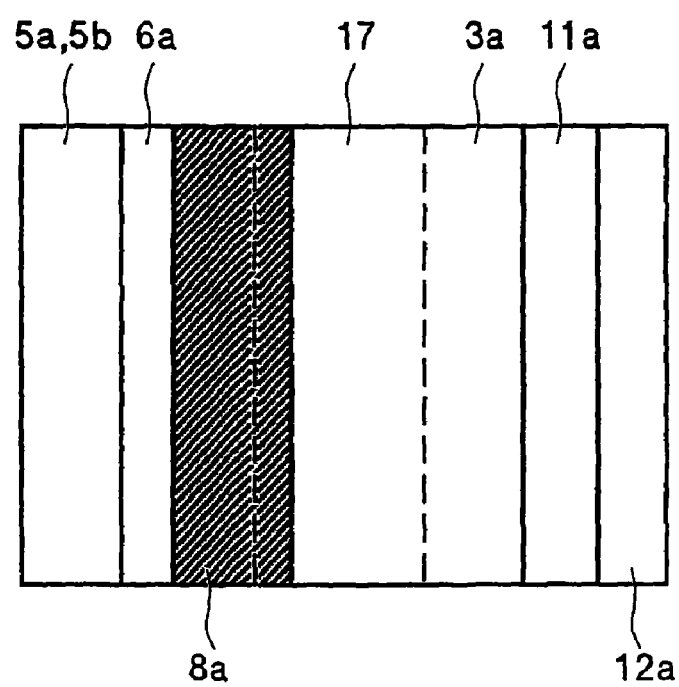
FIG. 48 is a planar layout diagram showing the main parts of the IGBT having the configuration shown in FIG. 46.

FIG. 48 is a view showing an example of the planar layout of the device according to the nineteenth embodiment. Referring to FIG. 48, in the device according to the nineteenth embodiment, the trench-filling insulating film 17 is disposed over the entire wafer surface between the n+ emitter region 6a (p+ emitter region 6b) and the p+ collector region 12a (n+ collector region 12b), and therefore the effective drift length is increased while the cell pitch on the wafer surface is shortened. In the device disclosed in the second reference, on the other hand, the cell pitch cannot be shortened, as described above.

Moreover, in the device according to the nineteenth embodiment, the amount of minority carrier implanted from the p+ collector region 12a (n+ collector region 12b) is limited by the distance between the trench-filling insulating film 17 and the n+ minority carrier canceling layer 13a (p+ minority carrier canceling layer 13b), similarly to the device disclosed in the second reference. On the other hand, conduction of a majority carrier flowing through the channel is not obstructed, and therefore the concentration of the majority carrier on the channel side can be maintained at a high level, enabling a reduction in channel resistance. Furthermore, by providing the n well region 3b (p well region 3d), the JFET effect is suppressed, and therefore a reduction in ON resistance and shortening of the cell pitch can be achieved. Further, by providing the p+ low resistance region 5a (n+ low resistance region 5c), a further increase in latchup immunity is achieved.

As described above, according to the first to nineteenth embodiments, by forming a trench, the part that holds the withstand voltage is provided in a vertical direction relative to the wafer surface. The drift region is thereby folded in the depth direction of the wafer and drawn out onto the wafer surface such that the effective drift length increases. Hence, even when the effective drift length is equal to that of a conventional device, the surface area required for the element is greatly reduced. Accordingly, the ON resistance per unit area decreases.

Further, according to the first to nineteenth embodiments, the n+ minority carrier canceling layer 13a (p+ minority carrier canceling layer 13b) serves as a getter layer in relation to metallic contamination, and therefore a gettering effect is obtained in relation to metallic contamination. As a result, the reliability of the gate insulating film 9a, 9b improves. Moreover, the n+ minority carrier canceling layer 13a (p+ minority carrier canceling layer 13b) suppresses the effect of defects on the interface with the n− drift region 3a (p− drift region 3c) and the interface with the insulating layer 2, and also suppresses a depletion effect from the p support substrate 1a (n support substrate 1b). Hence, the n− drift region 3a (p− drift region 3c) acts as a bulk layer.

Also according to the first to nineteenth embodiments, the dopant concentration of the n+ minority carrier canceling layer 13a (p+ minority carrier canceling layer 13b) is high, and therefore the life of the carrier is short. Hence, the life of the carrier implanted from the p+ collector region 12a (n+ collector region 12b) is controlled in accordance with the distance between the bottom of the trench-filling insulating film 17, the insulating layer 2, and the n+ minority carrier canceling layer 13a (p+ minority carrier canceling layer 13b) such that the balance between the reverse recovery time of the element and the ON resistance is maintained.

Further, according to the first to eighth, seventeenth and eighteenth embodiments, a lateral electric field generated on the collector side of the trench-filling insulating film 17 is blocked by the collector-side field plate 14 and the trench-filling insulating film 17, and an electric field generated at the PN junction formed by the n− drift region 3a (p− drift region 3c) and p base region 4a (n base region 4b) is reduced. Accordingly, electrical breakdown is less likely to occur. Furthermore, the collector-side field plate 14 has the same potential as the collector electrode 10, and therefore the interface of the n buffer region 11a (p buffer region 11b), or in other words the collector-side drift region that contacts the trench-filling insulating film 17, is less likely to deplete. Thus, the n buffer region 11a (p buffer region 11b) can perform a voltage support role.

By forming the trench, the part that holds the withstand voltage is provided in a vertical direction relative to the wafer surface. The drift region is thereby folded in the depth direction of the wafer and drawn out onto the wafer surface such that the effective drift length increases. Hence, even when the effective drift length is equal to that of a conventional device, the surface area required for the element is greatly reduced. Accordingly, the ON resistance per unit area can be decreased.

The collector-side conductive region can have the same potential as the collector electrode. Therefore, the interface of the fourth semiconductor region, or in other words the collector-side drift region that contacts the trench-filling insulating film, is less likely to deplete. Thus, the fourth semiconductor region can perform a voltage support role.

Further, the emitter-side conductive region and the trench-filling insulating film can block the lateral electric field generated on the emitter side of the trench-filling insulating film, reducing the electric field generated at the PN junction formed by the first semiconductor region and the third semiconductor region. Accordingly, electrical breakdown is less likely to occur. Furthermore, the potential of the emitter-side conductive region is a floating potential, and therefore the switching speed of the element is increased beyond that of a case in which the potential of the emitter-side conductive region is set at an emitter potential. The reason for this is that a capacitor formed between the emitter-side conductive region and the first semiconductor region is not connected in series to a capacitor formed between the collector and emitter of the IGBT. Therefore the collector-emitter capacitance of the IGBT does not increase.

Here, the potential difference between the emitter-side conductive region and the first semiconductor region is determined according to the capacitance between the collector-side conductive region and the emitter-side conductive region, and the capacitive coupling of the capacitance between the emitter-side conductive region and the first semiconductor region. When the thickness (see FIG. 1, D1 in FIG. 1) of the insulating film between the emitter-side conductive region and the first semiconductor region is much smaller than the thickness (see FIG. 1, 2D2+2D3 in FIG. 1) of the insulating film between the collector-side conductive region and the emitter-side conductive region, the potential of the emitter-side conductive region approaches a ground potential. Channels can be provided in relation to a drift region constituted by the single first semiconductor region to obtain a high current capability.

The semiconductor layer provided on the support substrate via the insulating layer can be formed by ion implantation and thermal diffusion. Therefore, the semiconductor layer serves as a getter layer in relation to metallic contamination. Hence, a gettering effect in relation to metallic contamination can be obtained. As a result, the reliability of the gate insulating film can be improved.

The semiconductor layer provided on the support substrate via the insulating layer suppresses the effect of defects on the interface with the first semiconductor region thereabove and the interface with the insulating layer therebelow, and also suppresses a depletion effect from the support substrate. Hence, the first semiconductor region can function as a bulk layer.

Furthermore, the dopant concentration of the semiconductor layer on the insulating layer is high, making the life of the carrier short. Hence, the life of the carrier implanted from the collector can be controlled in accordance with the distance between the bottom of the trench-filling insulating film and the semiconductor layer on the insulating layer such that the balance between the reverse recovery time of the element and the ON resistance can be maintained.

Hence, according to the present IGBT, an IGBT having a withstand voltage and a current driving capability that are equal to or greater than those of a conventional lateral semiconductor device employing a SOI substrate, higher latchup immunity than such a conventional lateral semiconductor device, and low ON resistance per unit area can be obtained. Furthermore, by employing a SOI substrate, integration with a CMOS device can be achieved easily.

The present IGBT is suitable for use in a high withstand voltage switching element requiring high latchup immunity, and particularly suited to a high withstand voltage switching element used at the output stage of a driver IC for a flat panel display, an on-vehicle IC, and so on. Further, the withstand voltage-holding structure of the present IGBT also can be applied to a lateral type LDMOS transistor or the like that requires a high withstand voltage to achieve a reduction in ON resistance per unit area.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

What is claimed is:

1. A SOI trench lateral IGBT comprising:
a support substrate;
a semiconductor layer of a first conductivity type on the support substrate via an insulating layer;
a first semiconductor region of the first conductivity type having a higher resistivity than the semiconductor layer on the semiconductor layer;
a second semiconductor region of the first conductivity type having a lower resistivity than the first semiconductor region on the first semiconductor region;
a third semiconductor region of a second conductivity type on the first semiconductor region in contact with the first semiconductor region and the second semiconductor region;
a gate electrode on the third semiconductor region via a gate insulating film;
an emitter region of the first conductivity type in the third semiconductor region;
a low resistance region of the second conductivity type in the third semiconductor region below the emitter region;
a high conductivity region of the second conductivity type in the third semiconductor region adjacent to the emitter region;
a fourth semiconductor region of the first conductivity type having a lower resistivity than the first semiconductor region on the first semiconductor region and spaced from the second semiconductor region and the third semiconductor region;
a collector region of the second conductivity type in the fourth semiconductor region;
a trench between the third semiconductor region and the fourth semiconductor region;
a trench-filling insulating film filling the trench;

an emitter electrode contacting the emitter region and the high conductivity region;
a collector electrode contacting the collector region;
an emitter-side conductive region having a floating potential buried in an upper half portion of the trench-filling insulating film in the vicinity of the third semiconductor region; and
a collector-side conductive region buried in the upper half portion of the trench-filling insulating film in the vicinity of the fourth semiconductor region,
wherein the collector electrode is electrically connected to the collector-side conductive region.

2. The SOI trench lateral IGBT according to claim 1, wherein the gate insulating film, the gate electrode, the third semiconductor region, the low resistance region, the emitter region, and the high conductivity region are each provided on one side of the trench-filling insulating film, and the emitter electrode electrically connects the emitter region and the high conductivity region to each other.

3. The SOI trench lateral IGBT according to claim 1, wherein the trench comprises an upper stage trench and a lower stage trench, the lower stage trench extending below a bottom of the upper stage trench and having a narrower width than the upper stage trench.

4. A SOI trench lateral IGBT comprising:
a support substrate;
a semiconductor layer of a first conductivity type on the support substrate via an insulating layer;
a first semiconductor region of the first conductivity type having a higher resistivity than the semiconductor layer on the semiconductor layer;
a second semiconductor region of the first conductivity type having a lower resistivity than the first semiconductor region on the first semiconductor region;
a third semiconductor region of a second conductivity type on the first semiconductor region in contact with the first semiconductor region and the second semiconductor region;
a gate electrode on the third semiconductor region via a gate insulating film;
an emitter region of the first conductivity type in the third semiconductor region;
a low resistance region of the second conductivity type in the third semiconductor region below the emitter region;
a high conductivity region of the second conductivity type in the third semiconductor region adjacent to the emitter region;
a fourth semiconductor region of the first conductivity type having a lower resistivity than the first semiconductor region on the first semiconductor region and spaced from the second semiconductor region and the third semiconductor region;
a collector region of the second conductivity type in the fourth semiconductor region;
a trench between the third semiconductor region and the fourth semiconductor region;
a trench-filling insulating film filling the trench;
an emitter electrode contacting the emitter region and the high conductivity region;
a collector electrode contacting the collector region;
an emitter-side conductive region having a floating potential buried in an upper half portion of the trench-filling insulating film in the vicinity of the third semiconductor region,
wherein the trench between the third semiconductor region and the fourth semiconductor region is spaced from the fourth semiconductor region.

5. The SOI trench lateral IGBT according to claim 4, wherein the gate insulating film, the gate electrode, the third semiconductor region, the low resistance region, the emitter region, and the high conductivity region are each provided on one side of the trench-filling insulating film, and the emitter electrode electrically connects the emitter region and the high conductivity region to each other.

6. The SOI trench lateral IGBT according to claim 4, wherein the trench comprises an upper stage trench and a lower stage trench, the lower stage trench extending below a bottom of the upper stage trench and having a narrower width than the upper stage trench.

7. A SOI trench lateral IGBT comprising:
a support substrate;
a semiconductor layer of a first conductivity type on the support substrate via an insulating layer;
a first semiconductor region of the first conductivity type having a higher resistivity than the semiconductor layer on the semiconductor layer;
a second semiconductor region of the first conductivity type having a lower resistivity than the first semiconductor region on the first semiconductor region;
a third semiconductor region of a second conductivity type on the first semiconductor region in contact with the first semiconductor region and the second semiconductor region;
a gate electrode on the third semiconductor region via a gate insulating film;
an emitter region of the first conductivity type in the third semiconductor region;
a low resistance region of the second conductivity type in the third semiconductor region below the emitter region;
a high conductivity region of the second conductivity type in the third semiconductor region adjacent to the emitter region;
a fourth semiconductor region of the first conductivity type having a lower resistivity than the first semiconductor region on the first semiconductor region and spaced from the second semiconductor region and the third semiconductor region;
a collector region of the second conductivity type in the fourth semiconductor region;
a trench between the third semiconductor region and the fourth semiconductor region, the trench being spaced from the third semiconductor region;
a trench-filling insulating film filling the trench;
an emitter electrode contacting the emitter region and the high conductivity region;
a collector electrode contacting the collector region;
a collector-side conductive region buried in an upper half portion of the trench-filling insulating film in the vicinity of the fourth semiconductor region,
wherein the collector electrode is electrically connected to the collector-side conductive region.

8. The SOI trench lateral IGBT according to claims 7, wherein the gate insulating film, the gate electrode, the third semiconductor region, the low resistance region, the emitter region, and the high conductivity region are each provided on one side of the trench-filling insulating film, and the emitter electrode electrically connects the emitter region and the high conductivity region to each other.

9. The SOI trench lateral IGBT according to claim 7, wherein the trench comprises an upper stage trench and a lower stage trench, the lower stage trench extending below a bottom of the upper stage trench and having a narrower width than the upper stage trench.

10. A SOI trench lateral IGBT comprising:

a support substrate;

a semiconductor layer of a first conductivity type on the support substrate via an insulating layer;

a first semiconductor region of the first conductivity type having a higher resistivity than the semiconductor layer on the semiconductor layer;

a third semiconductor region of a second conductivity type on the first semiconductor region in contact with the first semiconductor region;

a gate trench extending through the third semiconductor region and reaching the first semiconductor region;

a gate electrode inside the gate trench via a gate insulating film;

an emitter region of the first conductivity type in the third semiconductor region and in contact with the gate trench;

a low resistance region of the second conductivity type in the third semiconductor region adjacent to the emitter region;

a fourth semiconductor region of the first conductivity type having a lower resistivity than the first semiconductor region on the first semiconductor region and spaced from the third semiconductor region;

a collector region of the second conductivity type in the fourth semiconductor region;

a trench between the third semiconductor region and the fourth semiconductor region;

a trench-filling insulating film filling the trench;

an emitter-side conductive region having a floating potential buried in an upper half portion of the trench-filling insulating film in the vicinity of the third semiconductor region;

an emitter electrode contacting the emitter region and the low resistance region;

a collector electrode contacting the collector region; and a collector-side conductive region buried in the upper half portion of the trench-filling insulating film in the vicinity of the fourth semiconductor region, wherein the collector electrode is electrically connected to the collector-side conductive region.

11. The SOI trench lateral IGBT according to claim 10, wherein the gate insulating film, the gate electrode, the third semiconductor region, the low resistance region, the emitter region, and the high conductivity region are each provided on one side of the trench-filling insulating film, and the emitter electrode electrically connects the emitter region and the high conductivity region to each other.

12. The SOI trench lateral IGBT according to claim 10, wherein the trench comprises an upper stage trench and a lower stage trench, the lower stage trench extending below a bottom of the upper stage trench and having a narrower width than the upper stage trench.

* * * * *